US009059712B2

(12) United States Patent
Ishihara

(10) Patent No.: US 9,059,712 B2
(45) Date of Patent: Jun. 16, 2015

(54) OBJECT DETECTION SENSOR AND METHOD FOR PRODUCING THE SAME

(71) Applicant: ASMO CO., LTD., Shizuoka-ken (JP)

(72) Inventor: Hidenori Ishihara, Hamamatsu (JP)

(73) Assignee: ASMO CO., LTD., Shizuoka-ken (JP)

( * ) Notice: Subject to any disclaimer, the term of this patent is extended or adjusted under 35 U.S.C. 154(b) by 292 days.

(21) Appl. No.: 13/831,690

(22) Filed: Mar. 15, 2013

(65) Prior Publication Data

US 2013/0284576 A1 Oct. 31, 2013

(30) Foreign Application Priority Data

Mar. 21, 2012 (JP) ................. 2012-063948
Jan. 8, 2013 (JP) ................. 2013-001264

(51) Int. Cl.
| H01H 3/02 | (2006.01) |
| H01H 3/14 | (2006.01) |
| H03K 17/96 | (2006.01) |
| H01H 11/00 | (2006.01) |

(52) U.S. Cl.
CPC ............... *H03K 17/96* (2013.01); *H01H 11/00* (2013.01); *Y10T 29/49105* (2015.01); *H01H 3/142* (2013.01)

(58) Field of Classification Search
CPC ....... H03K 17/96; H01H 11/00; H01H 3/142; H01H 2003/148; H01H 3/161; H01H 2003/167; H01H 3/00; E05Y 2900/531; E05Y 2900/132; E05Y 2400/54; E05F 15/0021; Y10T 29/49002; Y10T 29/49105; Y10T 29/43; Y10T 29/49004; Y10T 29/49117; G01D 5/25

USPC .............................................. 200/52 R, 85 R
See application file for complete search history.

(56) References Cited

U.S. PATENT DOCUMENTS

| 5,192,837 | A | * | 3/1993 | Chardon .................... 200/61.41 |
| 6,107,580 | A | * | 8/2000 | Hoshikawa et al. ....... 200/61.43 |
| 6,260,418 | B1 | | 7/2001 | Ishihara et al. |
| 6,349,461 | B2 | | 2/2002 | Ishihara et al. |
| 6,668,660 | B2 | | 12/2003 | Ishihara et al. |
| 8,159,231 | B2 | * | 4/2012 | Sakamaki .................... 324/663 |
| 8,299,807 | B2 | | 10/2012 | Sakamaki et al. |
| 8,336,255 | B2 | * | 12/2012 | Shimizu et al. ................... 49/27 |
| 2002/0104373 | A1 | * | 8/2002 | Ishihara et al. ............. 73/118.1 |
| 2007/0022819 | A1 | * | 2/2007 | Takeuchi et al. ............... 73/756 |

FOREIGN PATENT DOCUMENTS

| JP | 11-191339 A | 7/1999 |
| JP | 11-237289 A | 8/1999 |
| JP | 2003-177068 A | 6/2003 |

(Continued)

*Primary Examiner* — Kyung Lee
(74) *Attorney, Agent, or Firm* — Christensen Fonder P.A.

(57) ABSTRACT

An object detection sensor includes a hollow insulator, a plurality of electrode wires, a terminal molded member, and a blocking member. The hollow insulator includes a longitudinal end. The electrode wires are arranged in the hollow insulator with the electrode wires spaced apart from each other. Each electrode wire includes a drawn-out portion that is drawn out of the hollow insulator from the longitudinal end of the hollow insulator. The terminal molded member is formed from an insulative terminal molding resin material. The drawn-out portions are embedded in the terminal molded member. The blocking member, which is arranged at the longitudinal end of the hollow insulator, blocks entrance of the terminal molding resin material into the hollow insulator.

12 Claims, 7 Drawing Sheets

(56) References Cited

FOREIGN PATENT DOCUMENTS

| JP | 2005-114395 A | 4/2005 |
| JP | 2010-015696 A | 1/2010 |
| JP | 2010-205452 A | 9/2010 |
| JP | 2012-058021 A | 3/2012 |

* cited by examiner

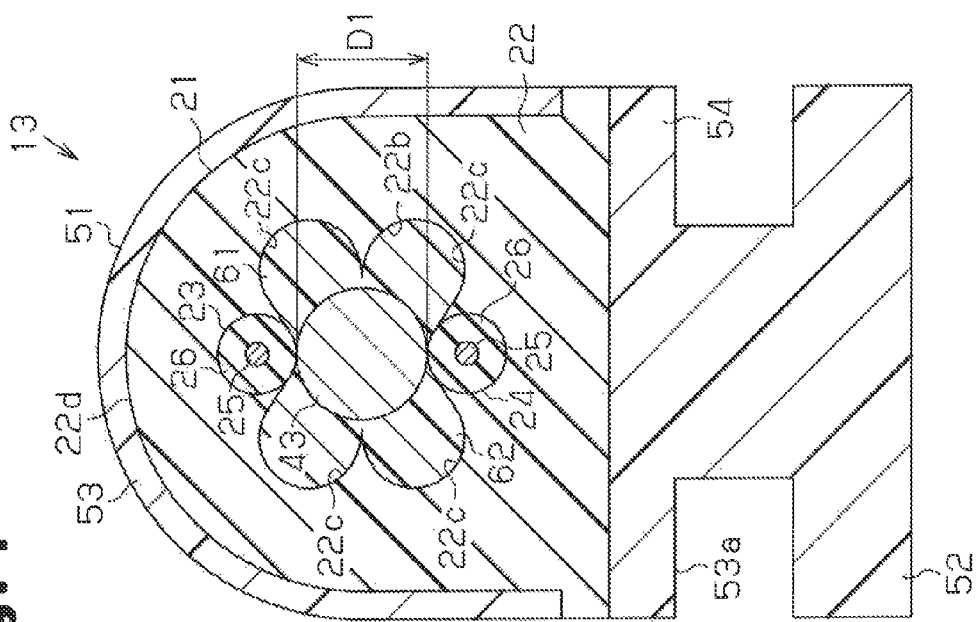
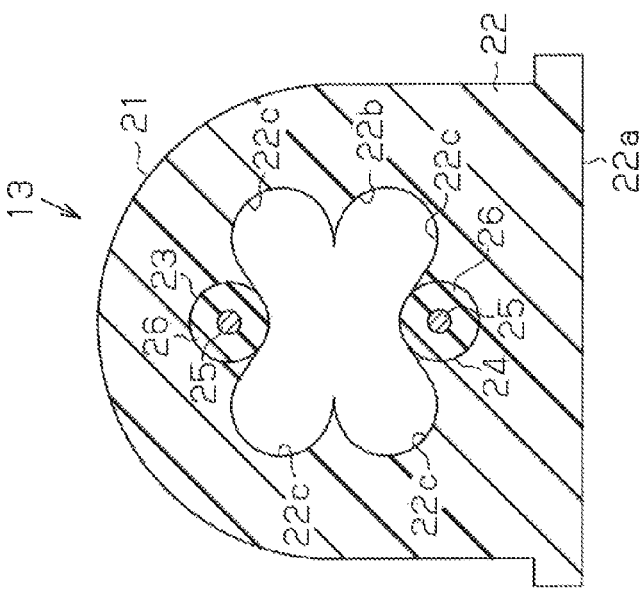

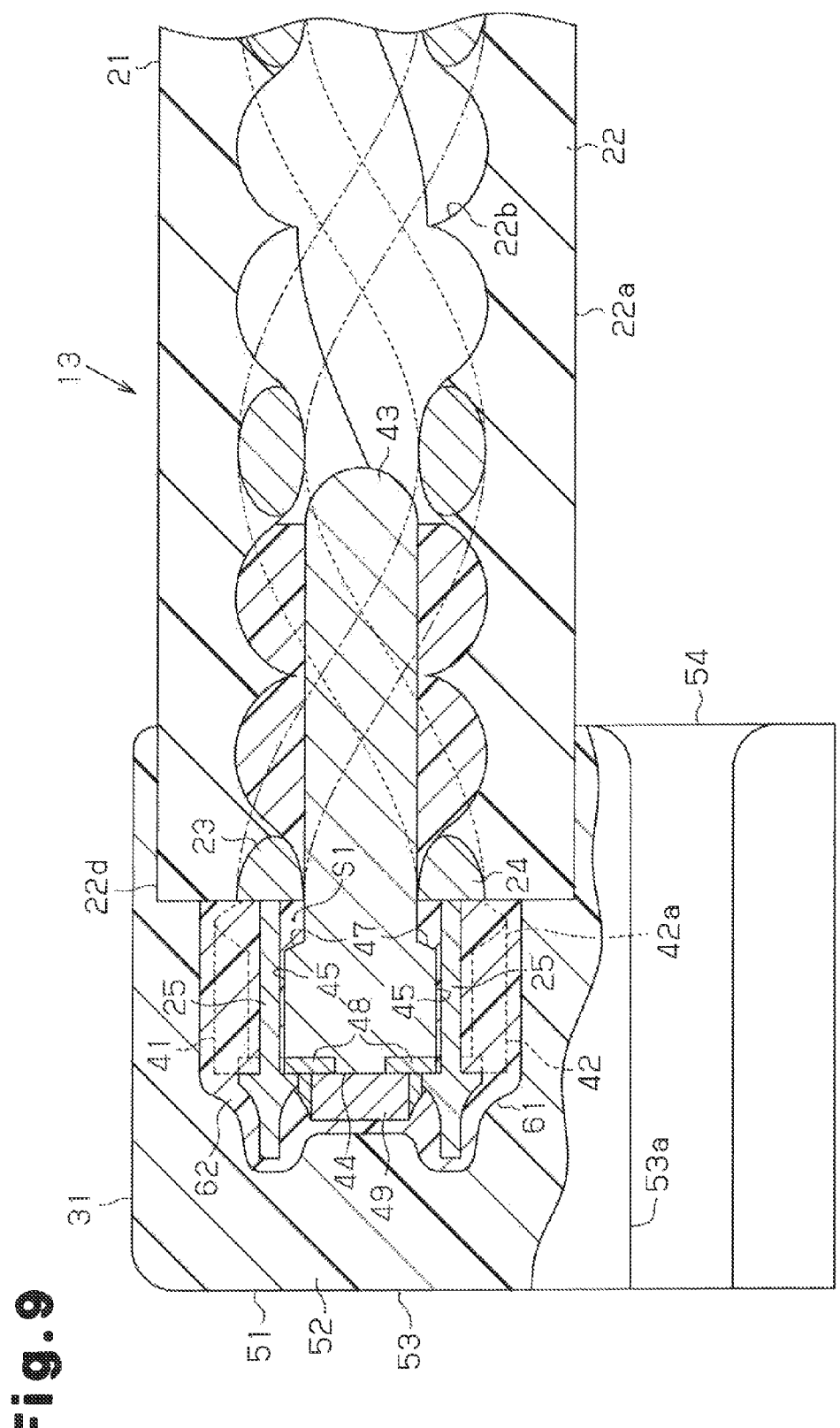

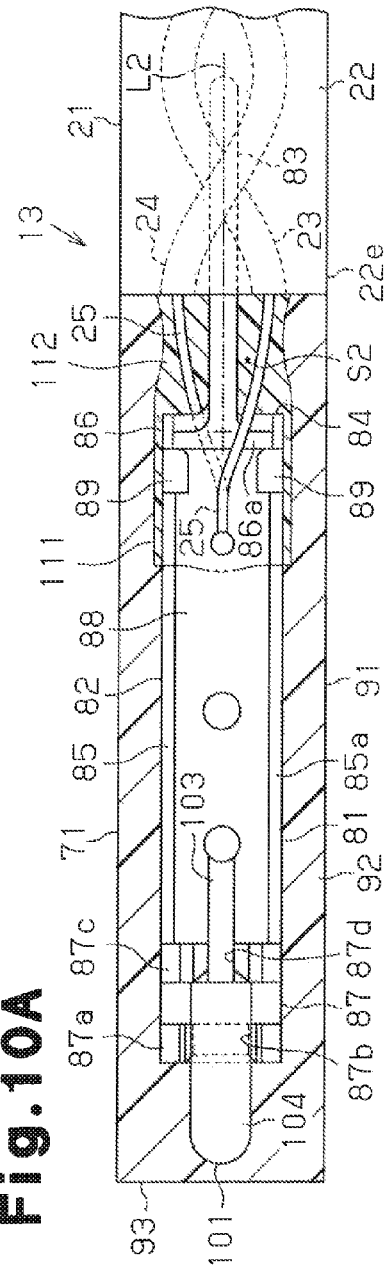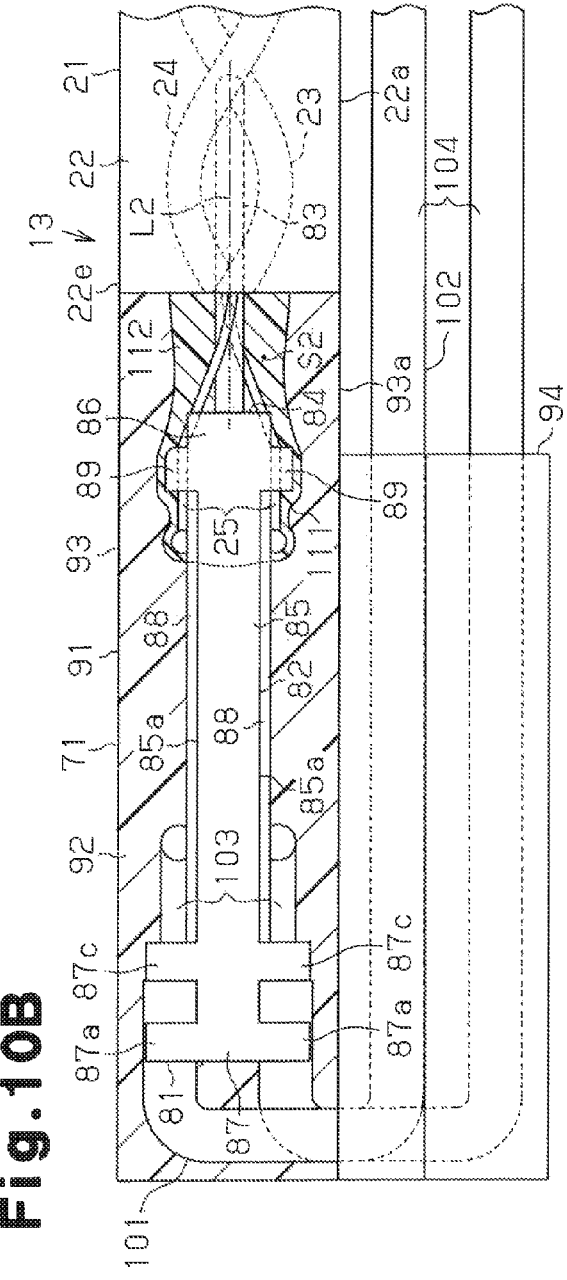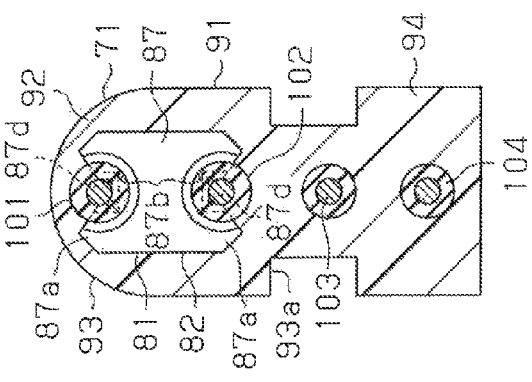

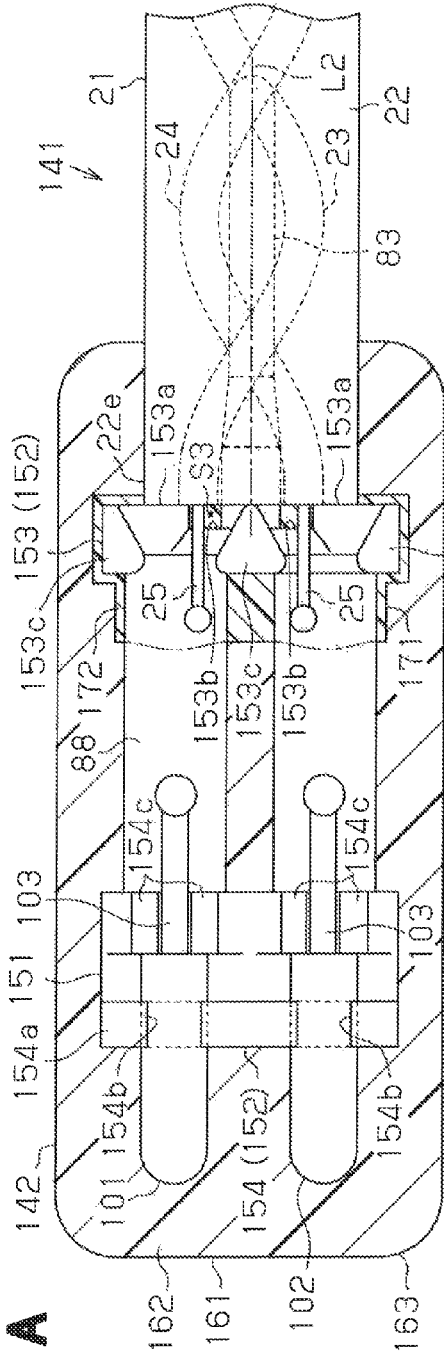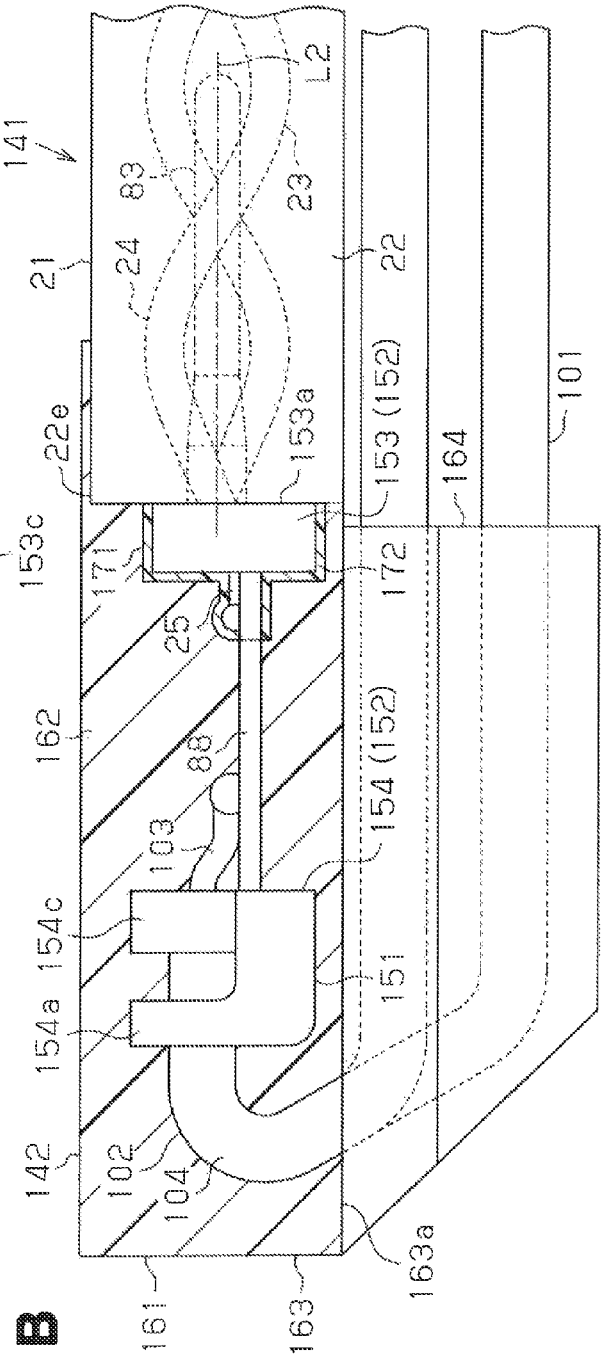

OBJECT DETECTION SENSOR AND METHOD FOR PRODUCING THE SAME

BACKGROUND OF THE INVENTION

The present invention relates to an object detection sensor and a method for producing the object detection sensor.

A conventional electric door opening and closing device, which opens and closes an opening (entrance, rear opening, and the like) formed in a vehicle body by moving a door panel with electric power using drive force of a motor and the like, includes an object detection sensor. The object detection sensor detects an object located between a peripheral portion of the opening and the door panel to prevent the object from being caught between the peripheral portion of the opening and the door panel.

Japanese Laid-Open Patent Publication No. 11-237289 describes an example of an object detection sensor that detects an object when elastically deformed by external force applied by the object. The object detection sensor includes a hollow insulator having an elongated cord-like shape. A bore extends through the hollow insulator in a longitudinal direction. Electrode wires extend through the hollow insulator in the longitudinal direction. Further, a support member is coupled to one end of the hollow insulator in the longitudinal direction. The support member supports a terminal electrically connected by welding and the like to electrode wires drawn out from the end of the hollow insulator in the longitudinal direction. The support member includes a spacer inserted into the bore of the hollow insulator and having a cross-sectional shape conforming to the cross-sectional shape of the bore. Further, a terminal molded member, which is formed from an insulative synthetic resin, covers the support member together with the longitudinal end of the adjacent hollow insulator. The terminal molded member is formed through injection molding or transfer molding.

When molding the terminal molded member of the object detection sensor described in Japanese Laid-Open Patent Publication No. 11-237289, the longitudinal end of the hollow insulator accommodating the support member and the spacer are arranged in a mold. Then, the mold is filled with melted resin to mold the terminal molded member. The melted resin is filled into the mold under a high pressure. Thus, the melted synthetic resin may enter the hollow insulator from between an outer circumferential surface of the spacer and an inner circumferential surface of the bore, move beyond the spacer, and advance deep into the bore.

SUMMARY OF THE INVENTION

It is an objective of the present invention to provide an object detection sensor that hinders the entrance of a resin material into a hollow insulator when forming a terminal molded member, and a method for producing the object detection sensor.

To achieve the above objective, one aspect of the present invention is an object detection sensor including a hollow insulator, a plurality of electrode wires, a terminal molded member, and a blocking member. The hollow insulator extends in a longitudinal direction and is insulative and elastic. The hollow insulator includes a longitudinal end. The electrode wires are arranged in the hollow insulator spaced apart from each other. Each of the electrode wires includes a drawn-out portion drawn out of the hollow insulator from the longitudinal end of the hollow insulator. The terminal molded member is formed from an insulative terminal molding resin material. The drawn-out portions are embedded in the terminal molded member. The blocking member is arranged at the longitudinal end of the hollow insulator. The blocking member blocks entrance of the terminal molding resin material into the hollow insulator.

A further aspect of the present invention is a method for producing an object detection sensor. The method includes preparing an insulative and elastic hollow insulator extending in a longitudinal direction. The hollow insulator includes a longitudinal end. The manufacturing method further includes arranging a plurality of electrode wires in the hollow insulator with the electrode wires spaced apart from each other. Each of the plurality of electrode wires includes a drawn-out portion drawn out of the hollow insulator from the longitudinal end of the hollow insulator. Further, the manufacturing method includes adhering an insulative blocking resin material to the longitudinal end of the hollow insulator to close the longitudinal end of the hollow insulator with the blocking resin material. The manufacturing method also includes hardening the blocking resin material after closing the longitudinal end of the hollow insulator. Moreover, the manufacturing method includes forming a terminal molded member with an insulative terminal molding resin material so that the drawn-out portions and the hardened blocking resin material are embedded in the terminal molded member.

BRIEF DESCRIPTION OF THE DRAWINGS

FIG. 3 is a cross-sectional diagram of a sensor portion taken along line II-II in FIG. 5;

FIG. 4 is a cross-sectional diagram of an object detection sensor taken along line IV-IV in FIG. 5;

FIG. 9 is a partial cross-sectional diagram of the object detection sensor;

FIGS. 10A and 10B are partial cross-sectional diagrams of a first embodiment of the object detection sensor;

FIG. 10C is a cross-sectional diagram of the first embodiment of the object detection sensor; and FIGS. 11A and 11B are partial cross-sectional diagrams of a second embodiment of the object detection sensor.

DETAILED DESCRIPTION OF THE PREFERRED EMBODIMENTS

First Embodiment

A first embodiment according to the present invention will now be described with reference to the drawings.

Figure 1:
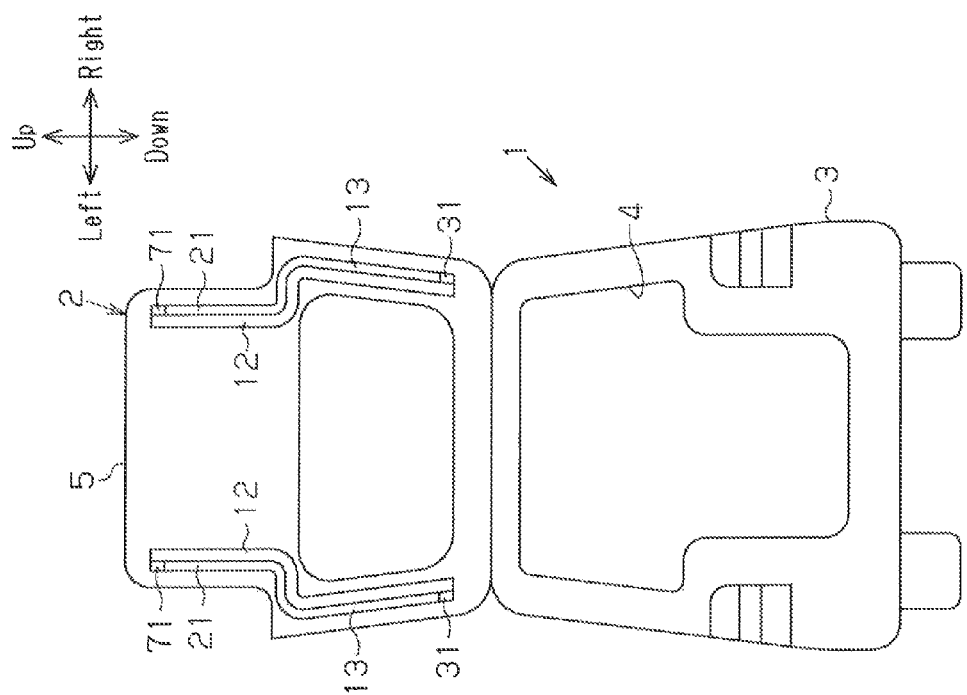
FIG. 1 is a schematic diagram of a vehicle including an object detection sensor according to the present invention.

As shown in FIG. 1, a vehicle 1 includes an electric back door device 2 installed therein. A back opening 4 is formed at the rear of a vehicle body 3 of the vehicle 1, and the back opening 4 is opened and closed by a door panel 5 having a shape corresponding to the back opening 4. An upper end of the door panel 5 is pivotally connected to an upper end of a back side face of the vehicle body 3. This allows the door panel 5 to pivot about the connecting portion with the vehicle body 3 so that a lower end of the door panel 5 moves in a vertical direction. The door panel 5 is moved between a fully closed, position and a fully open position. The fully closed position is a position at which the door panel 5 completely closes the back opening 4, and the fully open position is a position at which the door panel 5 completely opens the back opening 4.

Figure 2:
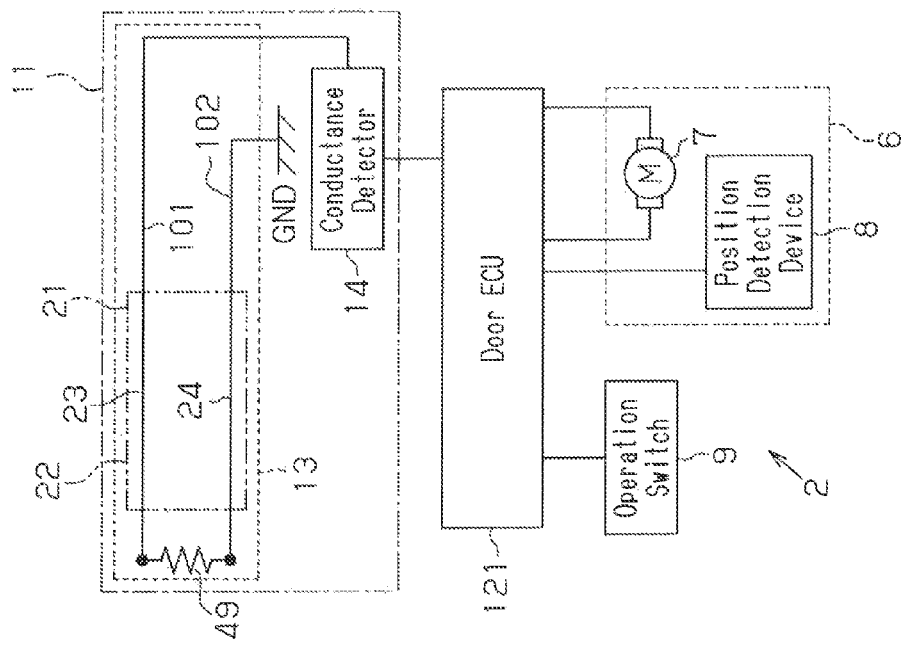
FIG. 2 is a block diagram showing the electric configuration of an electric back door device of FIG. 1.

As shown in FIG. 1 and FIG. 2, a drive mechanism (not shown), which includes an actuator 6 and is arranged in the vehicle body 3, is connected to the door panel 5. In the electric back door device 2, when the actuator 6 is driven, the door panel 5 is pivoted in the vertical direction to open and close the back opening 4.

As shown in FIG. 2, the actuator 6 includes a motor 7, and a reduction mechanism (not shown) that reduces the speed of the rotation produced by the motor 7 before outputting the rotation. Further, a position detection device 8 that detects the rotation of the motor 7 is arranged in the actuator 6. The position detection device 8 for example includes a magnet provided to rotate integrally with a rotation shaft (not shown) of the motor 7 or a reduction gear (not shown) that configures the reduction mechanism, and a hall IC (not shown) arranged to oppose the magnet. The hall IC outputs a pulse signal corresponding to changes in a magnetic field of the magnet caused by a rotation of the magnet as a position detection signal.

Further, the electric back door device 2 includes an operation switch 9 for instructing opening and closing of the door panel 5. As shown in FIG. 1 and FIG. 2, when operated by a passenger and the like of the vehicle 1 to open the back opening 4, the operation switch 9 outputs an open signal for pivoting the door panel 5 to open the back opening 4. When operated by the passenger and the like to close the back opening 4, the operation switch 9 outputs a close signal for pivoting the door panel 5 to close the back opening 4. The operation switch 9 is arranged in a predetermined location of a passenger compartment (dashboard and the like), a door lever (not shown) of the door panel 5, a component (not shown) carried together with an ignition key, and the like.

Further, the electric back door device 2 includes a object detection device 11 for detecting a object located between a peripheral portion of the door panel 5 and a peripheral portion of the back opening 4 that opposes the peripheral portion of the door panel 5. The object detection device 11 includes object detection sensors 13 coupled to the peripheral portion of the door panel 5 by brackets 12, and a conductance detector 14 electrically connected to the object detection sensors 13.

As shown in FIG. 1, the brackets 12 are fixed to the peripheral portion of the door panel 5 opposing the peripheral portion of the back opening 4, and more specifically, are respectively fixed to both ends in a lateral direction of an inner face of the door panel 5 (that is, a side face of the door panel 5 on a passenger compartment side). Each bracket 12 is substantially belt-shapes and vertically extends on the door panel 5 along the corresponding end of the door panel 5 in the lateral direction.

The object detection sensor 13 has an elongated cord-like shape. The object detection sensor 13 include a sensor portion 21 having the elongated cord-like shape, and a first terminal portion 31 and a second terminal portion 71 respectively provided at both ends of the sensor portion 21.

As shown in FIG. 3, the sensor portion 21 includes a hollow insulator 22 formed from an elastically deformable insulator (soft resin material, elastomer and the like). A belt-shaped adhesion surface 22a that extends along a longitudinal direction of the hollow insulator 22 is formed on an outer circumferential surface of the hollow insulator 22. The adhesion surface 22a has a straight linear shape in a cross-section vertically intersecting the longitudinal direction of the hollow insulator 22 (that is, cross-section shown in FIG. 3). Further, a portion of the outer circumferential surface of the hollow insulator 22 excluding the adhesion surface 22a has a substantially U shape that opens toward the adhesion surface 22a in the cross-section vertically intersecting the longitudinal direction of the hollow insulator 22. Accordingly, the hollow insulator 22 has a substantially D-shaped cross-section vertically intersecting the longitudinal direction.

Further, a bore 22b extending along the longitudinal direction of the hollow insulator 22 is formed in the hollow insulator 22. The bore 22b includes four separated recess portions 22c arranged along a circumferential direction of the bore 22b in the cross-section vertically intersecting the longitudinal direction of the hollow insulator 22. Further, the recess portions 22c extend toward the outer circumference. The bore 22b has a cross-sectional shape in a direction vertically intersecting the longitudinal direction of the hollow insulator 22 in a substantially X shape with the four separated recess portions 22c forming a shape of connected substantially at a central portion in the cross-section of the hollow insulator 22. Moreover, the bore 22b extends in the longitudinal direction of the hollow insulator 22 so that each of the four separated recess portions 22c is in a spiral shape. The hollow insulator 22 is hollow due to the bore 22b.

Figure 7:
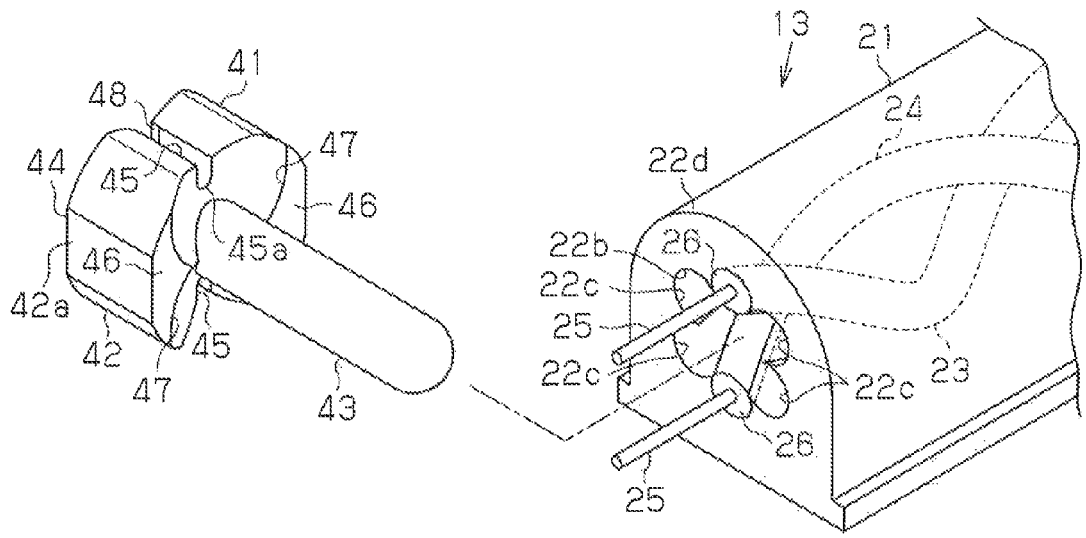
FIG. 7 is an exploded perspective diagram of the object detection sensor.

Further, two electrode wires 23 and 24 held in the hollow insulator 22 are arranged to oppose to each other while being spaced apart from each other in the hollow insulator 22. Each of the electrode wires 23 and 24 includes a center electrode 25 formed by braiding flexible and conductive thin wires. A cylindrical conductive covering layer 26, which is conductive and elastic, covers an outer circumference of the center electrode 25. Further, the two electrode wires 23 and 24 are arranged in the hollow insulator 22 and between the four separated recess portions 22c arranged in the circumferential direction. Two recess portions 22c are arranged between the electrode wire 23 and the electrode wire 24. Further, as shown in FIG. 3 and FIG. 7, the two electrode wires 23 and 24 are arranged in the hollow insulator 22 at equal angular intervals in the circumferential direction (which in the present embodiment is 180 degrees interval), and extend in a spiral shape in the longitudinal direction of the hollow insulator 22 along the separated recess portions 22c extending in the spiral shape while maintaining the constant interval between the wires (the interval in the circumferential direction). Further, the electrode wires 23 and 24 are held in the hollow insulator 22 by having parts of the wires embedded in the hollow insulator 22 in the hollow insulator 22. The two electrode wires 23 and 24 oppose to each other in the direction vertically intersecting the longitudinal direction of the hollow insulator 22 via the bore 22b at all positions in the longitudinal direction of the hollow insulator 22.

Figure 5:
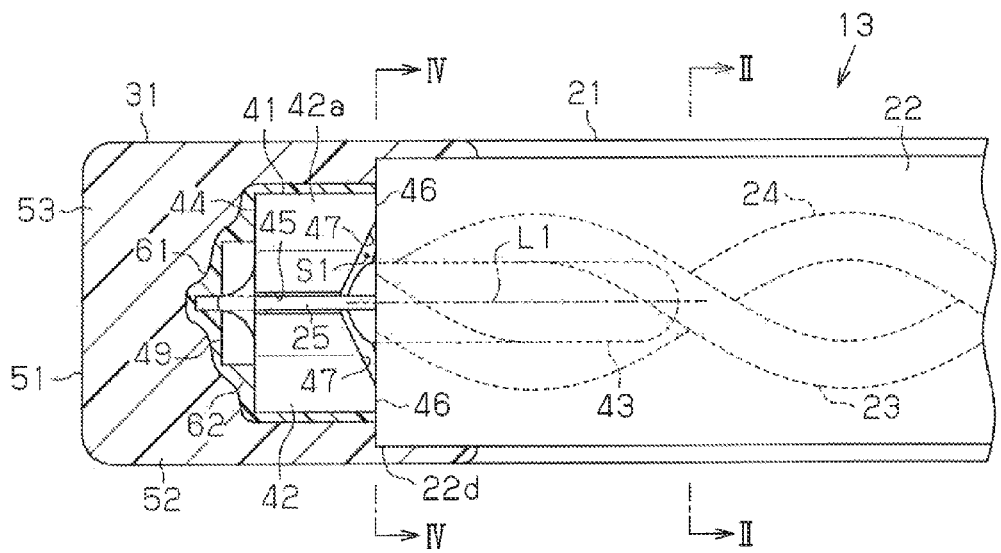
FIG. 5 is a partial cross-sectional diagram of the object detection sensor.

As shown in FIG. 5, the first terminal portion 31 is provided at one end of the hollow insulator 22 in the longitudinal direction (left side end in FIG. 2). As shown in FIG. 5 and FIG. 10A, in the present embodiment, among both ends of the hollow insulator 22 in the longitudinal direction, the end where the first terminal portion 31 is provided is defined as a first end 22d, and an end at an opposite side of the first end 22d is defined as a second end 22e. The first end 22d and the second end 22e each function as a longitudinal end. The first terminal portion 31 includes a first support member 41 arranged adjacent to the first end 22d of the hollow insulator 22, and a first terminal molded member 51 in which the first support member 41 is embedded.

Figure 6:
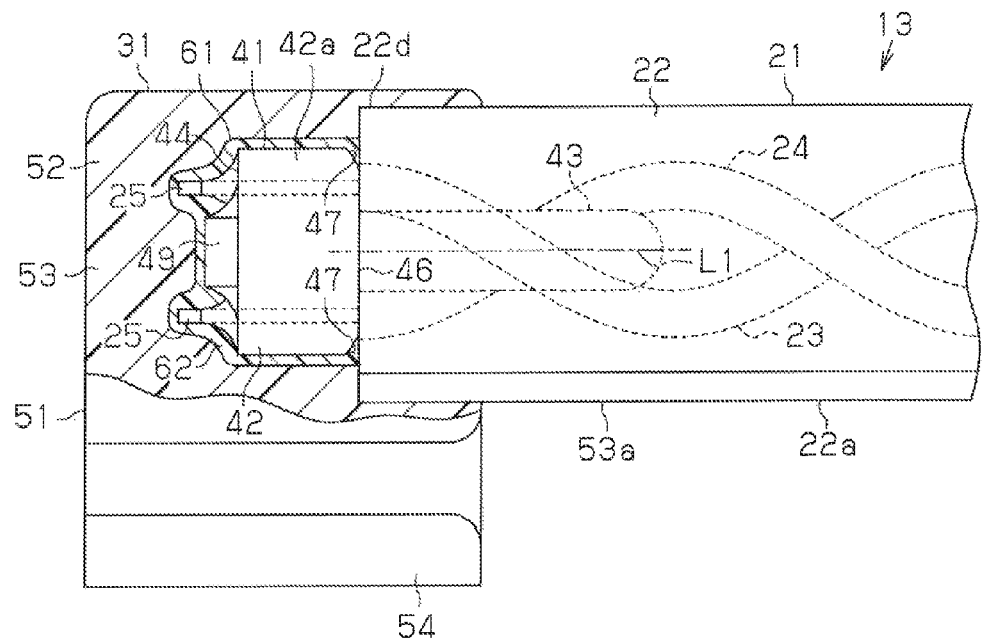
FIG. 6 is a partial cross-sectional diagram of the object detection sensor.

As shown in FIG. 5 to FIG. 7, the first support member 41 includes a first terminal supporting portion 42, and a first spacer 43 formed integrally with the first terminal supporting portion 42.

The first terminal supporting portion 42 has a substantially disk shape. An outer diameter of the first terminal supporting portion 42 is smaller than the cross-sectional shape vertically intersecting the longitudinal direction of the hollow insulator 22, and larger than the cross-sectional shape vertically intersecting the longitudinal direction of the hollow insulator 22 at the bore 22b. One end surface in a thickness direction of the first terminal supporting portion 42 (that is, an end surface on an opposite side from the hollow insulator 22) is a planar arrangement surface 44. Further, the first spacer 43 protrudes in an opposite direction of the arrangement surface 44 from an end center on the opposite side of the arrangement surface 44 in the first terminal supporting portion 42. The first spacer 43 has a cylindrical shape, and a center line L1 thereof vertically intersects with the arrangement surface 44. Further, as shown in FIG. 4, a diameter of the first spacer 43 is formed to be substantially equal to a width D1 of the interval between the electrode wires 23 and 24 opposing to each other in the hollow insulator 22.

Figure 8:
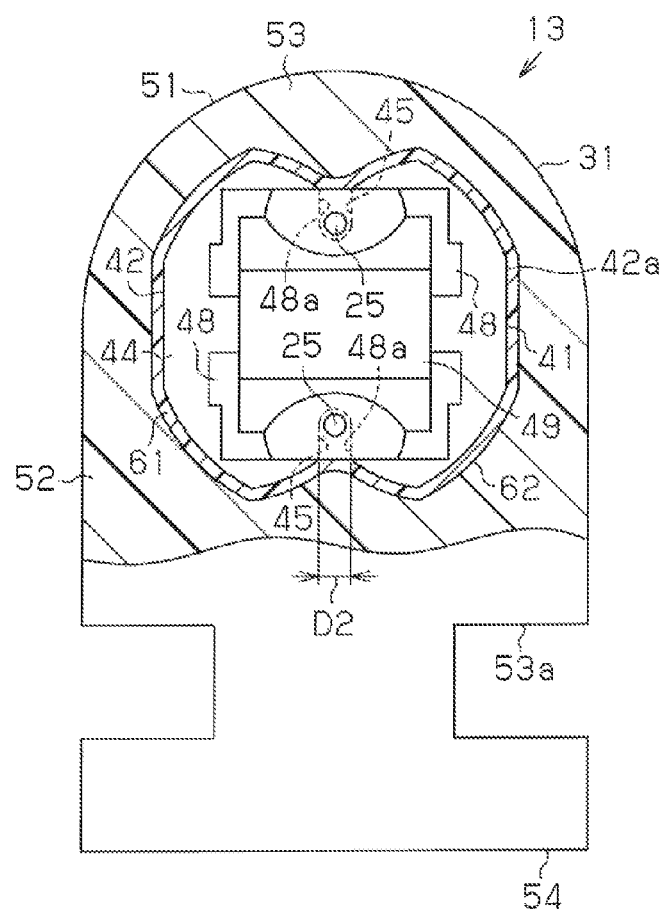
FIG. 8 is a partial cross-sectional diagram of the object detection sensor.

As shown in FIG. 5, FIG. 7, and FIG. 8, two supporting grooves 45 are formed on the first terminal supporting portion 42. The two supporting grooves 45 are respectively formed at two positions on a circumferential edge portion of the first terminal supporting portion 42 at a 180 degrees interval. Further, the two supporting grooves 45 is provided from an outer circumferential surface 42a of the first terminal supporting portion 42 toward a center of the first terminal supporting portion 42, and extends through the first terminal supporting portion 42 in a thickness direction of the first terminal supporting portion 42 (same as the protruding direction of the first spacer 43). Further, a width D2 of each supporting groove 45 is substantially equal to an outer diameter of the center electrodes 25 (by being somewhat wider), and a depth of each supporting groove 45 is greater than an outer diameter of the center electrodes 25.

As shown in FIG. 5 to FIG. 7, two contact surfaces 46 are formed at an end on the opposite side of the arrangement surface 44 in the first terminal supporting portion 42. The two contact surfaces 46 are formed between the two supporting grooves 45 and at two locations near the first spacer 43 at a 180-degree interval. Each of the contact surfaces 46 forms a right angle with the center line L1 of the first spacer 43, and is parallel to the arrangement surface 44. Further, the first support member 41 is coupled to the hollow insulator 22 in a state in which the first spacer 43 is inserted into the bore 22b from the first end 22d of the hollow insulator 22 and the pair of contact surfaces 46 in contact with an end surface of the first end 22d of the hollow insulator 22. As shown in FIG. 4, the first spacer 43 inserted into the bore 22b from the first end 22d (to the inside of the hollow insulator 22) prevents contact of the electrode wires 23 and 24 by being arranged between the two electrode wires 23 and 24 at the first end. 22d. As shown in FIG. 5, the first end 22d includes the end surface in the longitudinal direction where the first terminal portion 31 is provided in the hollow insulator 22 and a portion of the hollow insulator 22 where the first spacer 43 was inserted.

As shown in FIG. 5 to FIG. 7, two first guiding portions 47 are formed at the end in the vicinity of the contact surfaces 46 in the first terminal supporting portion 42. The first guiding portions 47 are formed between the two contact surfaces 46, and are formed at two locations near the first spacer 43 at a 180-degree interval. In the present embodiment, when the first terminal supporting portion 42 is viewed from a contact surface 46, the positions where the pair of first guiding portions 47 is formed are conform to the positions where the pair of supporting grooves 45 is formed. Further, the two first guiding portions 47 is formed at a portion near the two supporting grooves 45 and between the pair of contact surfaces 46 at the end in the vicinity of the contact surfaces 46 of the first terminal supporting portion 42, and formed over a range from the outer circumferential surface 42a of the first terminal supporting portion 42 to a base portion of the first spacer 43. Further, each first guiding portion 47 is recessed toward the arrangement surface 44, and has a shape in which a portion that protrudes toward a distal end of the first spacer 43 than the contact surface 46 is not provided. Further, each first guiding portion 47 is provided a recess so that its depth becomes deeper from the pair of contact surface 46 on both sides toward the supporting groove 45 formed between the pair of contact surfaces 46. Further, the two first guiding portions 47 are connected to each other at a substantially central portion of the end in the vicinity of the contact surfaces 46 of the first terminal supporting portion 42, and is formed so that their depths become gradually deeper as they extend away from their boundary, from the boundary to a vicinity of bottom portions 45a of the supporting grooves 45. Further, one first guiding portion 47 of the two first guiding portions 47 is intervened between the pair of contact surfaces 46 and the base portion of the first spacer 43, and the contact surfaces 46 and the first spacer 43 do not have any portion being directly adjacent. That is, the base portion of the first spacer 43 is surrounded by the two first guiding portions 47.

As shown in FIG. 5 and FIG. 7, by forming the first guiding portions 47 on the first terminal supporting portion 42, when the first spacer 43 is inserted into the bore 22b and the pair of contact surfaces 46 is in contact with the end surface of the first end 22d of the hollow insulator 22, a gap S1 that opens toward the outer circumferential surface 42a of the first terminal supporting portion 42 and communicates with the bore 22b is formed between the first terminal supporting portion 42 and the first end 22d. Further, at the first end 22d of the hollow insulator 22 into which the first spacer 43 is inserted, the bore 22b is not completely closed by the first spacer 43. At the first end 22d of the hollow insulator 22 into which the first spacer 43 is inserted, the first spacer 43 is not arranged in a portion on the outer circumferential side in each of separated recess portion 22c configuring the bore 22b, and thus the portion is not closed by the first spacer 43. Thus, at the end surface in the longitudinal direction of the first end 22d of the hollow insulator 22, the bore 22b includes an opening where the first spacer 43 is not arranged (opening that is not closed by the first spacer 43). The opening opens toward the first guiding portions 47, and communicates the gap S1 with the inside of the bore 22b.

As shown in FIG. 8 and FIG. 9, at the first terminal supporting portion 42, the end in the vicinity of the arrangement surface 44 in the first terminal supporting portion 42 supports two first terminals 48 configuring the first support member 41. Each of the first terminals 48 is conductive and has the shape of a substantially rectangular plate. The pair of first terminals 48 is embedded at two positions at the end in the vicinity of the arrangement surface 44 of the first terminal supporting portion 42 at a 180 degrees interval in the same manner as the pair of supporting grooves 45. More specifically, the two first terminals 48 are each embedded in the first terminal supporting portion 42 so that they have separated end surfaces that are flush to the arrangement surface 44 in a thickness direction. Further, each of the first terminals 48 has a connecting groove 48a at a portion that overlaps with the supporting groove 45 in a same shape as the supporting groove 45 when the first terminal supporting portion 42 is viewed from the arrangement surface 44.

Further, on the arrangement surface 44, a chip-type resistor 49 is arranged to extending over the pair of first terminals 48. Moreover, the center electrodes 25 of the two electrode wires 23 and 24 are each drawn out from the first end 22d of the hollow insulator 22. The portions of the electrode wires 23 and 24 drawn out from the first end 22d of the hollow insulator 22 function as drawn-out portions. The two center electrodes 25 are respectively inserted into the two supporting grooves 45 and supported by the supporting grooves 45. Distal ends of the two center electrodes 25 are respectively inserted into the connecting grooves 48a. Further, by soldering the first terminals 48, each of the first terminals 48, the center electrodes 25 inserted into the connecting grooves 48a of the first terminals 48, and the resistor 49 that is adjacent to the center electrodes 25 are connected by solder and electrically connected. That is, as shown in FIG. 2, longitudinal ends of the two electrode wires 23 and 24 (ends on the left side in FIG. 2) are electrically connected via the resistor 49. In the present embodiment, the first support member 41 supports the electrode wires 23 and 24 by the center electrodes 25 of the electrode wires 23 and 24 that are drawn out from the first end 22d of the hollow insulator 22 being respectively connected to the two first terminals 48 supported by the first terminal supporting portion 42.

As shown in FIG. 4, FIG. 5 and FIG. 9, a first blocking member 61 that blocks entrance of a first terminal molding resin material 52 configuring a first terminal molded member 51, described later, into the hollow insulator 22 is provided at the first end 22d of the hollow insulator 22. An ultraviolet curing resin material is used as a first blocking resin material 62 configuring the first blocking member 61. The first blocking member 61 covers the outer circumferential surface 42a of the first terminal supporting portion 42, portions of the respective first terminals 48 exposed from the first terminal supporting portion 42, a surface of the resistor 49, the soldered connecting portions of the first terminals 48, the center electrodes 25 and the resistor 49. Moreover, the first blocking member 61 fills the gap S1 formed between the first terminal supporting portion 42 and the first end 22d, enters the bore 22b from the opening of the bore 22b at the first end 22d of the hollow insulator 22, and fills between an outer circumferential surface of the first spacer 43 and an inner circumferential surface of the bore 22b. That is, the first blocking member 61 closes the opening of the first end 22d of the hollow insulator 22 in the bore 22b. In the first blocking member 61, the portion that covers the outer circumferential surface 42a of the first terminal supporting portion 42, the portions of the respective first terminals 48 exposed from the first terminal supporting portion 42, the surface of the resistor 49, and the soldered connecting portions of the first terminals 48, the center electrodes 25 and the resistor 49 are film-shaped.

As shown in FIG. 4 and FIG. 6, a first terminal molding resin material 52 configuring a first terminal molded member 51 is an insulative resin material. The first terminal molded member 51 includes a first terminal covering portion 53 in which the first support member 41 is embedded, and a first bracket engagement portion 54 for fixing the sensor portion 21 to the bracket 12.

The first terminal covering portion 53 is formed integrally to the first end 22d of the hollow insulator 22. The first terminal covering portion 53 in which the first support member 41 is embedded covers the outer circumferential surface of the first end 22d of the hollow insulator 22. Further, the first terminal covering portion 53 seals the first terminal supporting portion 42, the pair of first terminals 48, the soldered connecting portions of the resistor 49 and the first terminals 48, and the center electrodes 25 and the resistor 49 in a liquid-tight and air-tight manner. Further, an outer shape of the first terminal covering portion 53 is a shape that enlarges an outer shape of the hollow insulator 22 in size, and a shape in a cross-section vertically intersecting with a longitudinal direction of the sensor portion 21 of the first terminal covering portion 53 is substantially D-shaped.

The first bracket engagement portion 54 is formed integrally with a flat surface portion 53a of an outer circumferential surface of the first terminal covering portion 53. The first bracket engagement portion 54 protrudes from a central portion in a width direction of the flat surface portion 53a with a narrower width than a width of the flat surface portion 53a to form a right angle with the flat surface portion 53a. A distal end where the first bracket engagement portion 54 protrudes (lower end in FIG. 4) is formed at a width substantially equal to the flat surface portion 53a. Accordingly, the first bracket engagement portion 54 has a cross-section vertically intersecting the longitudinal direction of the sensor portion 21 that is substantially T-shaped.

As shown in FIG. 10A and FIG. 10B, a second terminal portion 71 is provided at the other end in the longitudinal direction of the hollow insulator 22 (end on the right side in FIG. 2). The second terminal portion 71 includes a second support member 81 arranged adjacent to a second end 22e of the hollow insulator 22, and a second terminal molded member 91 in which the second support member 81 is embedded.

The second support member 81 includes a second terminal supporting portion 82, and a second spacer 83 integrally formed with the second terminal supporting portion 82.

The second terminal supporting portion 82 has a substantially rectangular parallelepiped shape. The second terminal supporting portion 82 is narrower than the hollow insulator 22 and wider than the bore 22b. Further, the second spacer 83 protrudes in a longitudinal direction of the second terminal supporting portion 82 from a center of an end surface that is adjacent to the second end 22e of the hollow insulator 22 among the two end surfaces in the longitudinal direction of the second terminal supporting portion 82. The second spacer 83 has a cylindrical shape like the first spacer 43 (see FIG. 7). More specifically, the second spacer 83 is narrower than the second terminal supporting portion 82. Further, a diameter of the second spacer 83 is substantially equal to a width D1 of a space between the electrode wires 23 and 24 that oppose to each other at the inner side of the hollow insulator 22. Moreover, the second support member 81 is coupled to the hollow insulator 22 with a portion of the second spacer 83 on a distal end side being inserted into the bore 22b from a second end 22e of the hollow insulator 22. In the present embodiment, the second spacer 83 has about two-thirds of its portion from its distal end inserted into the bore 22b, and an end of the second terminal supporting portion 82 in the longitudinal direction closer to the hollow insulator 22 and the second end 22e of the hollow insulator 22 are separated in the longitudinal direction of the hollow insulator 22. Accordingly, at a basal end of the second spacer 83 (that is, in a periphery of a portion of the second spacer 83 that is not inserted into the hollow insulator 22), a gap S2 is formed between the end of the second terminal supporting portion 82 in the longitudinal direction closer to the hollow insulator 22 and the second end 22e of the hollow insulator 22. Further, in the second end 22e of the hollow insulator 22 to which the second spacer 83 is inserted, the bore 22b (see FIG. 3) is not completely closed by the second spacer 83. At the second end 22e of the hollow insulator 22 to which the second spacer 83 is inserted, a portion on an outer circumferential side of each separated recess portion 22c that configures the bore 22b (see FIG. 3) does not have the second spacer 83 arranged at the portion and thus is not closed by the second spacer 83. Due to this, at an end surface in the longitudinal direction closer to the second end 22e of the hollow insulator 22, the bore 22b includes the opening where the second spacer 83 is not arranged (the opening not closed by the second spacer 83). The opening opens toward the gap S2, and communicates the gap 82 and the inside of the bore 22b. Further, a second guiding portion 84 is configured by the gap 82, and the second guiding portion 84 opens to an outer circumferential side of the second spacer 83 and is connected to the bore 22b. Further, in the same manner as the first spacer 43 inserted, to the bore 22h from the first end 22d shown in FIG. 4, the second spacer 83 inserted to the bore 22b (in the hollow insulator 22) from the second end 22e prevents contact of the electrode wires 23 and 24 by being arranged between the two electrode wires 23 and 24 at the second end 22e. As shown in FIG. 10A, the second end 22e includes the end surface of the hollow insulator 22 in the longitudinal direction in the vicinity of the second terminal portion 71, and the portion of the hollow insulator 22 where the second spacer 83 is inserted.

As shown in FIG. 10A and FIG. 10B, the second terminal supporting portion 82 includes a terminal arrangement portion 85 having a rectangular parallelepiped shape (square cylindrical shape) formed at its central portion in the longitudinal direction, an electrode guiding portion 86 integrally formed at one end of the terminal arrangement portion 85 in the longitudinal direction (end in the vicinity of the second spacer 83), and a lead line guiding portion 87 integrally formed at the other end of the terminal arrangement portion 85 in the longitudinal direction.

Among the four flat surfaces configuring an outer circumferential surface of the terminal arrangement portion 85, two flat surfaces facing opposite directions from each other configure a pair of arrangement surfaces 85a. Further, a second terminal 88 is arranged on each of the two arrangement surfaces 85a. Each of the second terminals 88 configuring the second support member 81 is conductive, and has a rectangular plate shape. Further, each of the second terminals 88 is arranged on the corresponding arrangement surface 85a so that the arrangement surface 85a onto which the second terminal 88 is arranged intersects vertically with a thickness direction of each second terminal 88. Further, a length of each of the second terminals 88 in the longitudinal direction is formed substantially equal to a length of the arrangement surface 85a in the longitudinal direction, and a width of each of the second terminals 88 is formed somewhat narrower than a width of the arrangement surface 85a. Further, at an end of each of the arrangement surfaces 85a in the vicinity of the electrode guiding portion 86, a pair of fixing protrusions 89 is formed. The pair of fixing protrusions 89 on each of the arrangement surfaces 85a are formed to protrude from both ends in a width direction of the arrangement surface 85a at the ends of the arrangement surface 85a in the vicinity of the electrode guiding portion 86, and sandwich the second terminal 88 between the fixing protrusions 89 and the arrangement surface 85a.

Guiding surfaces 86a are formed at the two ends of the electrode guiding portion 86 in the direction vertically intersecting the arrangement surfaces 85a. Each of the guiding surfaces 86a is formed between the arrangement surface 85a and the basal end of the second spacer 83. Further, the two guiding surfaces 86a reduce the thickness of the electrode guiding portion 86 (thickness of the electrode guiding portion 86 in the direction vertically intersecting the arrangement surfaces 85a) at a side closer side to the basal end of the second spacer 83 along the longitudinal direction of the second terminal supporting portion 82, that is, are inclined to approach one another in the direction vertically intersecting the arrangement surfaces 85a.

The center electrodes 25 of the two electrode wires 23 and 24 are each drawn out from the second end 22e of the hollow insulator 22. The center electrode 25 of the one electrode wire 23 among the two electrode wires 23 and 24 (center electrode 25 above the plane of FIG. 10A) extends above the guiding surface 86a formed on one end of the electrode guiding portion 86 in the direction vertically intersecting the arrangement surfaces 85a and is guided by the guiding surface 86a, so that its distal end is arranged on the one second terminal 88. Further, the center electrode 25 of the one electrode wire 23 is electrically connected to the one second terminal 88 by welding. In the same manner, the center electrode 25 of the other electrode wire 24 among the two electrode wires 23 and 24 (center electrode 25 below the plane of FIG. 10A) extends above the guiding surface 86a formed on the other end of the electrode guiding portion 86 in the direction vertically intersecting the arrangement surfaces 85a and is guided by the guiding surface 86a, so that its distal end is arranged on the other second terminal 88. Moreover, the center electrode 25 of the other electrode wire 24 is electrically connected to the other second terminal 88 by welding. In the present embodiment, the second support member 81 supports the electrode wires 23 and 24 with the center electrodes 25 of the electrode wires 23 and 24 drawn out from the second end 22e of the hollow insulator 22 respectively connected to the two second terminals 88 supported by the second terminal supporting portion 82.

The lead line guiding portion 87 includes a pair of lead wire holding portions 87a at an end that is on the opposite side from the arrangement surface 85a along the longitudinal direction of the second terminal supporting portion 82 (that is, the end of the second terminal supporting portion 82 on the opposite side from the second spacer 83). The pair of lead wire holding portions 87a protrudes in an opposite direction from each other along the direction vertically intersecting the arrangement surface 85a. Further, as shown in FIG. 10C, each of the lead wire holding portions 87a has a holding recess portion 87b provided from a distal end to a basal end of the lead wire holding portion 87a. The holding recess portions 87b have an arcuate shape as viewed from the longitudinal direction of the second terminal supporting portion 82, and extend through the lead wire holding portions 87a in the longitudinal direction of the second terminal supporting portion 82.

As shown in FIG. 10A and FIG. 10B, the lead line guiding portion 87 includes two wire guiding portions 87c at the end in the vicinity of the arrangement surface 95a along the longitudinal direction of the second terminal supporting portion 82. The pair of wire guiding portions 87c protrudes in an opposite direction from each other along the direction vertically intersecting the arrangement surface 85a. Further, wire guiding portions 87c are separated in the longitudinal direction of the second terminal supporting portion 82 from the lead wire holding portions 87a. Further, in each of the wire guiding portions 87c, a guiding recess portion 87d is provided from a distal end to a basal end of each wire guiding portion 87c. As shown in FIG. 10C, the guiding recess portions 87d have a rectangular shape as viewed from the longitudinal direction of the second terminal supporting portion 82, and extend through the wire guiding portions 87c in the longitudinal direction of the second terminal supporting portion 82.

As shown in FIG. 10A to FIG. 10C, the lead line guiding portion 87 includes two lead wires 101 and 102. Each of the lead wires 101 and 102 is a coated conductive wire formed by coating a conductive metal wire 103 with an insulative insulating film 104. A distal end of each of the lead wires 101 and 102 has the insulating film 104 removed to expose the metal wire 103. Further, an outer diameter of the lead wires 101 and 102 is substantially equal to an inner diameter of the holding recess portions 87b. Further, an outer diameter of the metal wires 103 is substantially equal to a width of the guiding recess portions 87d (width in a same direction as the width direction of the arrangement surfaces 85a). Moreover, the two lead wires 101 and 102 have distal ends of the insulating films 104 respectively press fitted into the holding recess portions 87b of the pair of lead wire holding portions 87a, and the metal wires 103 exposed at the distal ends of the insulating films 104 are inserted into the guiding recess portions 87d of the wire guiding portions 87c. Thus, the two lead wires 101 and 102 are held in a state of having their distal ends guided to extend toward the second terminals 88 by the lead line guiding portion 87. Further, the metal wires 103 exposed at the distal ends of the respective lead wires 101 and 102 are guided by the guiding recess portions 87d and are arranged on the pair of second terminal 88, and are electrically connected to the second terminals 88 by welding. Accordingly, as shown in FIG. 2 and FIG. 10B, the two electrode wires 23 and 24 respectively electrically connect with the lead wires 101 and 102 via the second terminal 88 at the other end in the longitudinal direction of the electrode wires 23 and 24 (ends on the right side in FIG. 2). An end of one lead wire 101 among the two lead wires 101 and 102 on an opposite side from the second terminals 88 is electrically connected to the conductance detector 14, and an end of the other lead wire 102 on the opposite side from the second terminals 88 is electrically connected to a ground GND (that is, grounded to the vehicle body 3).

As shown in FIG. 10A and FIG. 10B, a second blocking member 111 that blocks entrance of a second terminal molding resin material 92 configuring a second terminal molded member 91, described later, into the hollow insulator 22 is provided on the second end 22e of the hollow insulator 22. In the present embodiment, an ultraviolet curing resin material similar to the first blocking resin material 62 is used as a second blocking resin material 112 that configures the second blocking member 111. The second blocking member 111 covers an outer circumference of the end in the longitudinal direction in the vicinity of the second spacer 83 of the second terminal supporting portion 82 supporting the second terminals 88 so that the portions of the second terminals 88 where the center electrodes 25 of the respective electrode wires 23 and 24 are covered. Further, the second blocking member 111 covers a surface of the basal end of the second spacer 83 to fill in the second guiding portion 84 (space S2), and fill a space between the outer circumferential surface of the second spacer 83 and the inner circumferential surface of the bore 22b by entering the bore 22b from the opening of the bore 22b at the second end 22e of the hollow insulator 22. That is, the second blocking member 111 closes the opening of the bore 22b at the second end 22e of the hollow insulator 22. In the second blocking member 111, the portion covering the second terminal supporting portion 82, the second terminals 88, and the connecting portions of the second terminals 88 and the center electrodes 25 has a film shape.

The second terminal molding resin material 92 that configures the second terminal molded member 91 is an insulative resin material similar to the first terminal molding resin material 52. The second terminal molded member 91 includes a second terminal covering portion 93 in which the second support member 81 is embedded, and a second bracket engagement portion 94 for fixing the sensor portion 21 to the bracket 12.

As shown in FIG. 10A to FIG. 10C, the second terminal covering portion 93 is integrally formed on the end surface of second end 22e of the hollow insulator 22. The second terminal covering portion 93 embeds the second terminal supporting portion 82 of the second support member 81 and a portion of the second spacer 83 that is arranged outside the hollow insulator 22. Further, the second terminal covering portion 93 seals the second terminal supporting portion 82, the pair of second terminals 88, the connecting portions of the second terminals 88 and the center electrodes 25, and the connecting portions of the second terminals 88 and the lead wires 101 and 102 in a liquid-tight and air-tight manner. Further, an outer shape of the second terminal covering portion 93 is formed similar to the outer shape of the hollow insulator 22, and a shape of the second terminal covering portion 93 in the cross-section vertically intersecting the longitudinal direction of the sensor portion 21 is a substantially D shaped. Further, an end surface of the second terminal covering portion 93 at the second end 22e of the hollow insulator 22 is in close contact with the second end 22e in a liquid-tight and air-tight manner.

The second bracket engagement portion 94 is integrally formed with a flat surface portion 93a having a flat surface shape in an outer circumferential surface of the second terminal covering portion 93. The second bracket engagement portion 94 protrudes from a central portion in a width direction of the flat surface portion 93a by forming a right angle with respect to the flat surface portion 93a with a narrower width than a width of the flat surface portion 93a. A distal end of the portion the second bracket engagement portion 94 protrudes (lower end in FIG. 10C) has a width that is substantially equal to the flat surface portion 93a. Accordingly, the second bracket engagement portion 94 is substantially T-shaped in the cross-section vertically intersecting the longitudinal, direction of the sensor portion 21. Further, the second bracket engagement portion 94 embeds portions on a distal end side of the two lead wires 101 and 102 that are respectively connected to the two second terminals 88. The two lead wires 101 and 102 extending from the lead line guiding portion 87 in the second terminal supporting portion 82 to an opposite side of the second spacer 83 are bent in a substantially U shape in the end of the second terminal supporting portion 82 at the opposite side from the second end 22e of the hollow insulator 22, and then extend parallel to each other along the longitudinal direction of the sensor portion 21 in the second bracket engagement portion 94. Further, the two lead wires 101 and 102 are drawn out of the second bracket engagement portion 94 from an end of the second bracket engagement portion 94 closer to the second end 22e of the hollow insulator 22.

As shown in FIG. 1, FIG. 6 and FIG. 10B, in the object detection sensor 13 configured as above, a basal end of the first bracket engagement portion 54 of the first terminal molded member 51 is inserted into an engagement groove (not shown) formed at one end in the longitudinal direction of the bracket 12, and a basal end of the second bracket engagement portion 94 of the second terminal molded member 91 is inserted into an engagement groove (not shown) formed at the other end in the longitudinal direction of the bracket 12. Further, the object detection sensor 13 is fixed to the bracket 12 by the adhesion surface 22a of the hollow insulator 22 adhered to the bracket 12 by a double sided tape (not shown). Further, the two lead wires 101 and 102 extending from the second bracket engagement portion 94 are drawn into the door panel 5, and are respectively connected to the conductance detector 14 and the ground GND in the door panel 5.

As shown in FIG. 1 and FIG. 2, the conductance detector 14 is arranged in the door panel 5. The conductance detector 14 supplies current to the electrode wire 23. Further, in a normal state under which no external force such as a pressing force is applied to the sensor portion 21, the current supplied to the electrode wire 23 from the conductance detector 14 flows in the electrode wire 24 via the resistor 49. When the external force that squeezes the sensor portion 21 is applied, the hollow insulator 22 at the portion where the external force is applied elastically deforms, and the electrode wires 23 and 24 are bent in accordance with the elastic deformation of the hollow insulator 22. Thus, the electrode wire 23 and the electrode wire 24 come into contact and are short-circuited via the conductive covering layer 26. As a result, the current supplied to the electrode wire 23 from the conductance detector 14 flows to the electrode wire 24 without flowing through the resistor 49. Accordingly, for example, in a case in which current is supplied to the electrode wire 23 at a certain constant voltage, a current value changes. Therefore, the conductance detector 14 detects an object in contact with the sensor portion 21 by detecting the change in the present current value. Further, when a change in the current value is detected, that is, when an object contacting the object detection sensor 13 is detected, the conductance detector 14 outputs a object detection signal to a door ECU 121, which will be described later. When the external force applied to the sensor portion 21 is removed, the hollow insulator 22 is restored, the electrode wires 23 and 24 are also restored, and a nonconductive state is assumed.

Further, the electric back door device 2 includes the door ECU 121 that controls opening and closing operations of the door panel 5 with the actuator 6 in the door panel 5. The door ECU 121 includes a ROM (random only memory) and a RAM (random access memory), functions as a microcomputer, and receives power from a battery (not shown) of the vehicle 1. Further, the door ECU 121 supplies current to the conductance detector 14 electrically connected to the door ECU 121. The door ECU 121 controls the actuator 6 based on various signals input from the operation switch 9, the position detection device 8, the conductance detector 14 and the like.

Next, the operation of the electric back door device 2 will be described.

When the open signal is input from the operation switch 9, the door ECU 121 drives the actuator 6 to open the door panel 5. The door ECU 121 recognizes a rotation position of the door panel 5 based on the position detection signal input from the position detection device 8. In the present embodiment, the door ECU 121 counts the number of pulses of the position detection signal, and recognizes the rotation position of the door panel 5 based on the counted value. Further, when the door panel 5 is arranged at the fully open position, the door ECU 121 stops the actuator 6.

When the close signal is input from the operation switch 9, the door ECU 121 drives the actuator 6 to close the door panel 5. Further, when the door panel 5 is arranged at the fully closed position, the door ECU 121 stops the actuator 6. If the external force is applied to the sensor portion 21 by the object in contact with the sensor portion 21 of the object detection sensor 13 during the closing operation of the door panel 5, the electrode wire 23 and the electrode wire 24 come into contact and are short-circuited by the hollow insulator 22 elastically deformed in the object detection sensor 13. As a result, since the current value of the current supplied to the electrode wire 23 changes, the conductance detector 14 outputs the object detection signal to the door ECU 121. When the object detection signal is input, the door ECU 121 inverts the actuator 6 to open the door panel 5 for a predetermined amount, and then stops the actuator 6.

Next, a method for manufacturing the object detection sensor 13 of the first embodiment will be described with reference to FIG. 3 to FIG. 10C, together with the operation of the object detection sensor 13.

Firstly, a support member coupling step of coupling the first support member 41 and the second support member 81 to the hollow insulator 22 is performed. In the support member coupling step, the first support member 41 is coupled to the first end 22d by inserting the first spacer 43 to the bore 22h from the first end 22d of the hollow insulator 22. The first spacer 43 is inserted into the bore 22b until the pair of contact surfaces 46 of the first terminal supporting portion 42 contacts the first end 22d of the hollow insulator 22. Further, the center electrodes 25 of the two electrode wires 23 and 24 drawn out from the first end 22d are respectively inserted into the supporting grooves 45, and are respectively arranged in the connecting grooves 48a of the first terminals 48. Further, each of the first terminals 48, the center electrodes 25 arranged in the connecting grooves 48a of the respective first terminals 48, and side surfaces of the resistor 49 adjacent to the center electrode 25 are respectively electrically connected by soldering.

Further, in the support member coupling step, the second support member 81 is coupled to the second end 22e by inserting the second spacer 83 into the bore 22b from the second end 22e of the hollow insulator 22. The second spacer 83 has two-thirds of its portion from its distal end inserted into the bore 22b. Further, while the center electrodes 25 of the two electrode wires 23 and 24 drawn out from the second end 22e are respectively guided by the guiding surfaces 86a adjacent to the second terminals 88, the distal end of each of the center electrodes 25 is arranged on the corresponding second terminal 88, and then the center electrodes 25 are respectively electrically connected to the second terminals 88 by welding. Further, the distal ends of the two lead wires 101 and 102 are press fitted into the holding recess portions 87b of the pair of lead wire holding portions 87a, and the metal wires 103 exposed at the distal ends of the lead wires 101 and 102 by removing the insulating film 104 are inserted into the guiding recess portions 87d of the pair of wire guiding portions 87c. Moreover, the distal ends of the respective lead wires 101 and 102 guided toward the second terminals 88 by the guiding recess portions 87d are respectively electrically connected to the second terminals 88 by welding.

Next, a hardening step of forming the first blocking member 61 and the second blocking member 111 is performed. In the hardening step, the first blocking resin material 62, having flowability before being hardened, is applied from the arrangement surface 44 to the portion of the first support member 41 outside the hollow insulator 22, and is adhered thereto. A predetermined amount of the first blocking resin material 62 is arranged on the arrangement surface 44, and flows toward the first end 22d of the hollow insulator 22 from the arrangement surface 44 side by flowing on the surface of the first support member 41. Further, the first blocking resin material 62 covers the outer circumferential surface 42a of the first terminal supporting portion 42, the portion of each first terminal 48 exposed from the first terminal supporting portion 42, the surface of the resistor 49, and the soldered connecting portions of the first terminals 48 and the center electrodes 25 and the resistor 49. Further, since the first support member 41 has the first guiding portion 47 at the first terminal supporting portion 42, the gap S1 that opens on the outer circumferential surface 42a of the first terminal supporting portion 42 and communicates with the bore 22*b* is formed between the first terminal supporting portion 42 and the first end 22*d* in the state in which the first spacer 43 is inserted into the bore 22*b* and the pair of contact surfaces 46 in contact with the end surface of the first end 22*d* of the hollow insulator 22. Thus, the first blocking resin material 62 flowing toward the first end 22*d* of the hollow insulator 22 from the arrangement surface 44 by flowing over the surface of the first support member 41 is likely to flow between the end of the first terminal supporting portion 42 in the vicinity of the first spacer 43 and the first end 22*d* of the hollow insulator 22 (that is in the gap S1) by being guided by the first guiding portion 47. Further, at the end surface of the first end 22*d* of the hollow insulator 22 in the longitudinal direction, the bore 22*b* has the opening where the first spacer 43 is not arranged (opening that is not closed by the first spacer 43). The opening opens toward the first guiding portion 47 and thus allows the first blocking resin material 62 to enter between the outer circumferential surface of the first spacer 43 inserted in the hollow insulator 22 and the inner circumferential surface of the hollow insulator 22. Accordingly, the first blocking resin material 62 fills the gap S1, enters the bore 22*b* from the opening of the bore 22*b* at the first end 22*d* of the hollow insulator 22, and fills between the outer circumferential surface of the first spacer 43 and the inner circumferential surface of the bore 22*b*. That is, the first blocking resin material 62 closes the opening of the bore 22*b* at the first end 22*d* of the hollow insulator 22. Then, the first blocking member 61 is formed from the first blocking resin material 62 by irradiating ultraviolet ray to the first blocking resin material 62 and hardening the first blocking resin material 62.

Further, in the hardening step, the second blocking resin material 112, having flowability before being hardened, is applied to the portion of the second support member 81 outside the hollow insulator 22 which is the portion closer to the second spacer 83 than a substantial central portion of the second terminal supporting portion 82 in the longitudinal direction, and adhered thereto. A predetermined amount of the second blocking resin material 112 is arranged at the substantially central portion of the second terminal supporting portion 82 in the longitudinal direction, and flows toward the second end 22*e* of the hollow insulator 22 by flowing over the surfaces of the second support member 81 and the second terminals 88. Then, the second blocking resin material 112 covers the portions of the second terminals 88 where the center electrodes 25 of the respective electrode wires 23 and 24 are connected, and covers the outer circumference of the end of the second terminal supporting portion 82 supporting the second terminals 88, in the vicinity of the second spacer 83 in the longitudinal direction. Further, the second guiding portion 84 formed from the gap 52 communicated with the bore 22*h* is formed between the end of the second terminal supporting portion 82 in the longitudinal direction closer to the hollow insulator 22 and the second end 22*e* of the hollow insulator 22 in the vicinity of the basal end of the second spacer 83 (that is, in the periphery of the portion of the second spacer 83 that is not inserted in the hollow insulator 22). Thus, the second blocking resin material 112 flowing toward the second end 22*e* of the hollow insulator 22 by flowing on the surface of the second support member 81 is likely to flow between the end of the second terminal supporting portion 82 in the vicinity of the second spacer 83 and the second end 22*e* of the hollow insulator 22 (that is, in the second guiding portion 84 (space S2)) by being guided by the second guiding portion 84. Further, at the end surface of the second end 22*e* of the hollow insulator 22 in the longitudinal direction, the bore 22*b* includes the opening where the second spacer 83 is not arranged (opening that is not closed by the second spacer 83). Since this opening opens toward the gap S2, it allows the second blocking resin material 112 to enter between the outer circumferential surface of the second spacer 83 inserted in the hollow insulator 22 and the inner circumferential surface of the hollow insulator 22. Accordingly, the second blocking resin material 112 covers the surface of the basal end of the second spacer 83 to fill in the second guiding portion 84 (space 52), enters into the bore 22*b* from the opening of the bore 22*b* at the second end 22*e* of the hollow insulator 22, and fills between the outer circumferential surface of the second spacer 83 and the inner circumferential surface of the bore 22*b*. That is, the second blocking resin material 112 closes the opening of the bore 22*b* at the second end 22*e* of the hollow insulator 22. Then, the second blocking member 111 is formed from the second blocking resin material 112 by hardening the second blocking resin material 112 by irradiating the ultraviolet ray.

Next, a terminal forming step of forming the first terminal molded member 51 and the second terminal molded member 91 is performed. In the terminal forming step, the first support member 41 and the first end 22*d* of the hollow insulator 22 are arranged in a mold (not shown) for forming the first terminal molded member 51, and the mold is filled by injecting melted first terminal molding resin material 52. That is, in the present embodiment, the first terminal molded member 51 is formed by injection molding. In this case, since the opening of the bore 22*b* at the first end 22*d* of the hollow insulator 22 is closed by the first blocking member 61, entrance is blocked of the melted first terminal molding resin material 52 into the bore 22*b* from the first end 22*d*, that is, into the hollow insulator 22 by the first blocking member 61. Accordingly, since the melted first terminal molding resin material 52 is prevented from entering to the inside of the hollow insulator 22 from between the outer circumferential surface of the first spacer 43 and the inner circumferential surface of the bore 22*b*, the melted first terminal molding resin material 52 is prevented from entering deep into the bore 22*b* by passing over the first spacer 43. Further, since the first blocking member 61 covers the soldered connecting portions of the respective first terminals 48, the center electrodes 25, and the resistor 49, the soldered connecting portions are protected by the first blocking member 61 when the first terminal molding resin material 52 is filled into the mold. Then, the first terminal molded member 51 is formed by hardening the first terminal molding resin material 52 in the mold. Accordingly, the first terminal portion 31 is formed at one longitudinal end of the sensor portion 21.

Further, in the terminal forming step, the second support member 81 and the second end 22*e* of the hollow insulator 22 are arranged in a mold (not shown) for forming the second terminal molded member 91, and the mold is filled by injecting melted second terminal molding resin material 92. That is, in the present embodiment, the second terminal molded member 91 is formed by injection molding. In this case, since the opening of the bore 22*b* at the second end 22*e* of the hollow insulator 22 is closed by the second blocking member 111, entrance is blocked of the melted second terminal molding resin material 92 into the bore 22*b* from the second end 22*e*, that is, the inside of the hollow insulator 22 by the second blocking member 111. Accordingly, since the melted second terminal molding resin material 92 is prevented from entering to the inside of the hollow insulator 22 from between the outer circumferential surface of the second spacer 83 and the inner circumferential surface of the bore 22*h*, the melted second terminal molding resin material 92 is prevented from entering deep into the bore 22*b* by passing over the second spacer 83.

Further, since the second blocking member 111 covers the connecting portions of the respective second terminals 88 and the center electrodes 25, the connecting portions are protected by the second blocking member 111 upon filling the second terminal molding resin material 92 into the mold. Then, the second terminal molded member 91 is formed by the second terminal molding resin material 92 being hardened within the mold. Accordingly, the second terminal portion 71 is formed at the other end of the sensor portion 21 in the longitudinal direction. Further, when the terminal forming step is completed, the object detection sensor 13 is completed.

As described above, the first embodiment has the following advantages.

(1) Entrance of the first terminal molding resin material 52 configuring the first terminal molded member 51 into the hollow insulator 22 (that is, in the bore 22h) is blocked by the first blocking member 51 when forming the first terminal molded member 51. In the same manner, entrance of the second terminal molding resin material 92 configuring the second terminal molded member 91 into the hollow insulator 22 (that is, in the bore 22h) is blocked by the second blocking member 111 when forming the second terminal molded member 91. Accordingly, since the first and second terminal molding resin materials 52 and 92 are prevented from entering to the inside of the hollow insulator 22, occurrences of defective products caused by the first and second terminal molding resin materials 52 and 92 when manufacturing the object detection sensor 13 may be reduced.

(2) Since the first blocking member 61 is formed from the first blocking resin material 62 that is a resin material, and the second blocking member 111 is formed from the second blocking resin material 112 that is a resin material, the first blocking member 51 and the second blocking member 111 can easily be formed into desired shapes. Accordingly, the first blocking member 61 can easily be provided in the middle of a path along which the first terminal molding resin material 52 enters inside the hollow insulator 22, and the second blocking member 111 can easily be provided in the middle of a path along which the second terminal molding resin material 92 enters into the hollow insulator 22. Therefore, the entrances of the first and second terminal molding resin materials 52 and 92 into the hollow insulator 22 can effectively be blocked by the first and second blocking members 61, 111.

(3) Since the electrode wires 23 and 24 drawn out of the hollow insulator 22 from the first end 22d are supported by the first support member 41 so that the contact between the electrode wires 23 and 24 is prevented, the electrical short-circuiting of the electrode wires 23 and 24 drawn out of the hollow insulator 22 from the first end 22d is prevented. Further, since the electrode wires 23 and 24 drawn out of the hollow insulator 22 from the second end 22e are supported by the second support member 81 so that the contact between the electrode wires 23 and 24 is prevented, the electrical short-circuiting of the electrode wires 23 and 24 drawn out of the hollow insulator 22 from the second end 22e is prevented.

(4) The first spacer 43 is inserted into the hollow insulator 22 from the first end 22d. Thus, the first end 22d of the hollow insulator 22 may be prevented from being deformed by the pressure that acts on the first end 22d of the hollow insulator 22 when forming the first terminal molded member 51 from the first terminal molding resin material 52, and the force that acts on the first end 22d of the hollow insulator 22 by contraction when the first terminal molding resin material 52 is hardened. Accordingly, the electrical short-circuiting of the electrode wires 23 and 24 can further be suppressed at the first end 22d of the hollow insulator 22. Further, the second spacer 83 is inserted into the hollow insulator 22 from the second end 22e. Thus, the second end 22e of the hollow insulator 22 may be prevented from being deformed by the pressure that acts on the second end 22e of the hollow insulator 22 when forming the second terminal molded member 91 from the second terminal molding resin material 92 or the force that acts on the end of the hollow insulator 22 in the longitudinal direction by contraction when the second terminal molding resin material 92 is hardened. Accordingly, electrical short-circuiting of the electrode wires 23 and 24 may be further reduced at the second end 22e of the hollow insulator 22.

(5) When forming the first blocking member 61, the first blocking resin material 62 in the flowable state is guided between the first terminal supporting portion 42 of the first support member 41 and the first end 22d of the hollow insulator 22 opposing in the longitudinal direction of the hollow insulator 22 by the first guiding portion 47. The space between the first terminal supporting portion 42 of the first support member 41 and the first end 22d, of the hollow insulator 22 opposing in the longitudinal direction of the hollow insulator 22 becomes a path through which the first terminal molding resin material 52 passes when forming the first terminal molded member 51 as the first terminal molding resin material 52 enters the hollow insulator 22. Accordingly, by guiding the first blocking resin material 62 between the first terminal supporting portion 42 of the first support member 41 and the first end 22d of the hollow insulator 22 opposing in the longitudinal direction of the hollow insulator 22 by the first guiding portion 47, the first blocking member 61 can be formed between the first terminal supporting portion 42 of the first support member 41 and the first end 22d of the hollow insulator 22 opposing in the longitudinal direction of the hollow insulator 22. Similarly, when forming the second blocking member 111, the second blocking resin material 112 in the flowable state is guided between the second terminal supporting portion 82 of the second support member 81 and the second end 22e of the hollow insulator 22 opposing in the longitudinal direction of the hollow insulator 22 by the second guiding portion 84. The space between the second terminal supporting portion 82 of the second support member 81 and the second end 22e of the hollow insulator 22 opposing in the longitudinal direction of the hollow insulator 22 becomes a path through which the second terminal molding resin material 92 passes when forming the second terminal molded member 91 as the second terminal molding resin material 92 enters the hollow insulator 22. Accordingly, by guiding the second blocking resin material 112 between the second terminal supporting portion 82 of the second support member 81 and the second end 22e of the hollow insulator 22 opposing in the longitudinal direction of the hollow insulator 22 by the second guiding portion 84, the second blocking member 111 can be formed between the second terminal supporting portion 82 of the second support member 81 and the second end 22e of the hollow insulator 22 opposing in the longitudinal direction of the hollow insulator 22. As a result, the first and second terminal molding resin materials 52 and 92 are effectively prevented from entering the hollow insulator 22.

(6) The opening that allows the first blocking resin material 62 to enter between the outer circumferential surface of the first spacer 43 inserted to the hollow insulator 22 from the first end 22d and the inner circumferential surface of the hollow insulator 22 is provided at the first end 22d of the hollow insulator 22. Thus, the first blocking resin material 62 can enter between the outer circumferential surface of the first spacer 43 inserted in the first end 22d of the hollow insulator 22 and the inner circumferential surface of the hollow insulator 22 from the opening provided at the first end 22d of the hollow insulator 22. Accordingly, at the first end 22d of the hollow insulator 22, the space between the outer circumferential surface of the first spacer 43 and the inner circumferential surface of the hollow insulator 22 is more easily closed by the first blocking member 61 formed from the first blocking resin material 62. As a result, when forming the first terminal molded member 51, the first terminal molding resin material 52 may be more effectively prevented from entering the inside of the hollow insulator 22 from the first end 22d. Further, the opening that allows the second blocking resin material 112 to enter between the outer circumferential surface of the second spacer 83 inserted to the hollow insulator 22 from the second end 22e and the inner circumferential surface of the hollow insulator 22 is provided at the second end 22e of the hollow insulator 22. Thus, the second blocking resin material 112 can enter between the outer circumferential surface of the second spacer 83 inserted to the second end 22e of the hollow insulator 22 and the inner circumferential surface of the hollow insulator 22 from the opening provided at the second end 22e of the hollow insulator 22. Accordingly, at the second end 22e of the hollow insulator 22, the space between the outer circumferential surface of the second spacer 83 and the inner circumferential surface of the hollow insulator 22 becomes more easily closed by the second blocking member 111 formed from the second blocking resin material 112. As a result, in forming the second terminal molded member 91, the second terminal molding resin material 92 can be more effectively prevented from entering the inside of the hollow insulator 22 from the second end 22e.

(7) The first blocking member 61 and the second blocking member 111 are formed from ultraviolet curing resin. Since the ultraviolet curing resin exhibits flowability under low pressure or no pressure, its handling is easy. Accordingly, the step of forming the first blocking member 61 and the second blocking member ill (that is, the hardening step) can be simplified. Further, since the ultraviolet curing resin exhibits flowability under low pressure or no pressure, the ultraviolet curing resin that is to be the first blocking member 61 and the second blocking member 111 entering deep into the hollow insulator 22 can easily be prevented.

(8) In the hardening step, the first end 22d of the hollow insulator 22 is closed by the first blocking resin material 62, and the first blocking resin material 62 is hardened. Similarly, in the hardening step, the second end 22e of the hollow insulator 22 is closed by the second blocking resin material 112, and the second blocking resin material 112 is hardened. Further, since the terminal forming step is performed after the hardening step, even when the first terminal molding resin material 52 and the second terminal molding resin material 92 are injected under high pressure in the terminal forming step, the first terminal molding resin material 52 and the second terminal molding resin material 92 are respectively blocked from entering the hollow insulator 22 by the hardened first blocking resin material 62 (that is, the first blocking member 61) and second blocking resin material 112 (that is, the second blocking member 111). Accordingly, since entrance of the first and second terminal molding resin materials 52 and 92 into the hollow insulator 22 is prevented, defected products caused by the first and second terminal molding resin materials 52 and 92 during manufacturing of the object detection sensor 13 are reduced.

(9) The support member coupling step is performed before the hardening step, and therefore, the contact of the two electrode wires 23 and 24 is prevented by the first spacer 43 at the first end 22d of the hollow insulator 22, and the portions of the electrode wires 23 and 24 drawn out from the first end 22d of the hollow insulator 22 are supported by the first support member 41 provided with the first spacer 43. In the same manner, the contact of the two electrode wires 23 and 24 is prevented by the second spacer 83 at the second end 22e of the hollow insulator 22, and the portions of the electrode wires 23 and 24 drawn out from the second end 22e of the hollow insulator 22 are supported by the second support member 81 provided with the second spacer 83. Accordingly, the electrical short-circuiting of the electrode wires 23 and 24 is prevented at both ends of the hollow insulator 22 in the longitudinal direction, and the hardening step and the terminal forming step can be performed.

(10) In the hardening step, the first end 22d of the hollow insulator 22 is closed by the hardened first blocking resin material 62 (that is, the first blocking member 61) by adhering and hardening the first blocking resin material 62 having flowability onto the first end 22d of the hollow insulator 22 in a state in which the first spacer 43 is inserted and the first support member 41 is coupled to the first end 22d of the hollow insulator 22. In the same manner, in the hardening step, the second end 22e of the hollow insulator 22 is closed by the hardened second blocking resin material 112 (that is, second blocking member 111) by adhering and hardening the second blocking resin material 112 having flowability to the second end 22e of the hollow insulator 22 when the second spacer 83 is inserted and the second support member 81 is coupled to the second end 22e of the hollow insulator 22. Further, since the terminal forming step is performed after the hardening step, even when the melted first terminal molding resin material 52 is injected at high pressure in the terminal forming step, entrance of the first terminal molding resin material 52 into the hollow insulator 22 is blocked by the hardened first blocking resin material 62 (that is, the first blocking member 61). In the same manner, in the terminal forming step, even when the melted second terminal molding resin material 92 is injected at high pressure, entrance of the second terminal molding resin material 92 into the hollow insulator 22 is blocked by the hardened second blocking resin material 112 (that is, second blocking member 111). Accordingly, since the first terminal molding resin material 52 and the second terminal molding resin material 92 are prevented from entering the hollow insulator 22, defected products caused by the first terminal molding resin material 52 and the second terminal molding resin material 92 when manufacturing the object detection sensor 13 are reduced.

(11) The first blocking member 61 covers the soldered connecting portions of the first terminals 48, the center electrodes 25, and the resistor 49. Thus, the soldered connecting portions are protected by the first blocking member 61 when filling the first terminal molding resin material 52 to the mold. In the same manner, the second blocking member 111 covers the connecting portions of the respective second terminals 88 and the center electrodes 25. Thus, the connecting portions are protected by the second blocking member 111 when filling the second terminal molding resin material 92 in the mold. Accordingly, in the terminal forming step, when injecting the first terminal molding resin material 52 and the second terminal molding resin material 92, load applied to the electric connecting portions of the electrode wires 23 and 24 and the center electrodes 25, the first terminals 48, and the second terminals 88 is reduced.

(12) When coupling the first support member 41 to the first end 22d of the hollow insulator 22, by causing the pair of contact surfaces 46 to contact the end surface of the first end 22d of the hollow insulator 22, the positioning of the hollow insulator 22 to the first support member 41 in the longitudinal direction can easily be performed. Accordingly, the coupling of the first support member 41 to the hollow insulator 22 can be easily performed.

(13) In the hardening step, the first blocking resin material 62 is adhered to the first end 22d of the hollow insulator 22 by applying the first blocking resin material 62, having flowability before being hardened, to the portion of the first support member 41 outside the hollow insulator 22 from the arrangement surface 44. This closes the opening of the bore 22b at the first end 22d of the hollow insulator 22. In the same manner, in the hardening step, the second blocking resin material 112 is adhered to the second end 22e of the hollow insulator 22 by applying the second blocking resin material 112, having flowability before being hardened, to the portion of the second support member 81 on the outside of the hollow insulator 22, which is the portion closer to the second spacer 83 than the substantial central portion of the second terminal supporting portion 82 in the longitudinal direction, and the opening of the bore 22b at the second end 22e of the hollow insulator 22 is closed. Further, since a mold does not need to be used when forming the first blocking member 61 and the second blocking member 111, equipment cost for manufacturing the object detection sensor 13 can be reduced.

(14) The first support member 41 supports the center electrodes 25 with the supporting grooves 45. Thus, when applying the first blocking resin material 62 to the outer circumferential surface of the first support member 41 in the hardening step, shifting of the position of the center electrodes 25 with respect to the first support member 41 and shifting of the position of the center electrodes 25 with respect to the first terminals 48 and the resistor 49 may be prevented. Accordingly, when forming the first blocking member 61, load can be prevented from being applied to the electrical connecting portions of the center electrodes 25, the first terminals 48, and the resistor 49.

(15) The first guiding portions 47 have a simple shape and are just recessed. Accordingly, the shape of the first support members 41 is prevented from becoming complicated. Further, the second guiding portion 84 has a simple shape configured by separating the second terminal supporting portion 82 and the second end 22e of the hollow insulator 22 in the longitudinal direction of the hollow insulator 22. Accordingly, the shapes of the second support member 81 and the second end 22e are prevented from becoming complicated.

Second Embodiment

A second embodiment of the present invention will now be described with reference to the drawings. In the second embodiment, same reference characters are given to those components that are the same as the corresponding components of the first embodiment. Such components will not be described As shown in FIG. 11A and FIG. 11B, an object detection sensor 141 of the second embodiment is provided in an object detection device 11 in lieu of the object detection sensor 13 of the first embodiment. Compared to the object detection sensor 13 of the first embodiment, the object detection sensor 141 of the second embodiment includes a second terminal portion 142 instead of the second terminal portion 71.

The second terminal portion 142 includes a second support member 151 arranged adjacent to a second end 22e of a hollow insulator 22, and a second terminal molded member 161 that embeds the second support member 151.

The second support member 151 includes a second terminal supporting portion 152 that supports a pair of second terminals 88, and a second spacer 83 formed integrally with the second terminal supporting portion 152.

The second terminal supporting portion 152 includes an electrode guiding portion 153 and a lead line guiding portion 154 separated from each other in a longitudinal direction of the hollow insulator 22. The electrode guiding portion 153 has a substantially rectangular parallelepiped shape that is elongated in a diameter direction of the hollow insulator 22. Further, the second spacer 83 protrudes toward the second end 22e of the hollow insulator 22 (that is, to an opposite side from the lead line guiding portion 154) from a central portion of the electrode guiding portion 153 in the longitudinal direction (that is, in one direction along the diameter direction of the hollow insulator 22).

A pair of contact surfaces 153a is formed on the electrode guiding portion 153 at a portion opposing the second end 22e of the hollow insulator 22 in the longitudinal direction of the hollow insulator 22 at both sides in a diameter direction of the second spacer 83 (both sides of the second spacer 83 along the longitudinal direction of the electrode guiding portion 153). The contact surfaces 153a are formed to vertically intersect a center line L2 direction of the second spacer 83. Moreover, the second support member 151 is coupled to the hollow insulator 22 when the second spacer 83 is inserted to the bore 22b from the second end 22e of the hollow insulator 22 and the pair of contact surfaces 153a in contact with an end surface of the second end 22e of the hollow insulator 22. The pair of contact surfaces 153a contacts the end surface of the second end 22e of the hollow insulator 22 on an outer circumferential side of the bore 22b.

Further, second guiding portions 153b are formed in the electrode guiding portion 153 respectively between each of the contact surfaces 153a and a basal end of the second spacer 83. Each of the second guiding portions 153b is a substantially rectangular recessed portion that opens toward the second end 22e of the hollow insulator 22, which vertically intersects with the longitudinal direction of the electrode guiding portion 153 and penetrates the electrode guiding portion 153 in a direction vertically intersecting the center line L2 of the second spacer 83 (vertical direction with respect to a sheet surface in FIG. 11A). By forming the second guiding portions 153b in the electrode guiding portion 153, when the second spacer 83 is inserted to the bore 22b and the pair of contact surfaces 153a is in contact with the end surface of the second end 22e of the hollow insulator 22, a gap S3 is formed between the electrode guiding portion 153 and the second end 22e. The gap S3 opens toward the outer circumferential surface of the electrode guiding portion 153, and communicates with the bore 22b (inside of the hollow insulator 22). Further, in the second end 22e of the hollow insulator 22 to which the second spacer 83 is inserted, the bore 22b (see FIG. 3) is not completely closed by the second spacer 83. At the second end 22e of the hollow insulator 22 to which the second spacer 83 is inserted, a portion on an outer circumferential side of each separated recess portion 22c that configures the bore 22b (see FIG. 3) does not have the second spacer 83 arranged at the portion and is thus not closed by the second spacer 83. Thus, at the end surface of the second end 22e of the hollow insulator 22 in the longitudinal direction, the bore 22b includes openings where the second spacer 83 is not arranged (openings not closed by the second spacer 83). The openings open toward the gap S3, and communicate the gap S3 and the inside of the bore 22b.

Further, guiding projection portions 153c are formed in the electrode guiding portion 153 at a total of three positions, namely, a central portion of the electrode guiding portion 153 in the longitudinal direction, and both ends of the electrode guiding portion 153 in the longitudinal direction. The three guiding projection portions 153c protrude to one side in a direction vertically intersecting the longitudinal direction of the electrode guiding portion 153 and vertically intersecting the center line L2 of the second spacer 83 (front side with respect to the sheet surface of FIG. 11B). Further, among the three guiding projection portions 153c, the central guiding projection portion 153c is formed between the two second guiding portions 153b.

Further, the electrode guiding portion 153 holds longitudinal ends of the two second terminals 88, which are rectangular plate-shaped. The two second terminals 88 configuring the second support member 151 are separated from one another to have their width direction conform to the longitudinal direction of the electrode guiding portion 153, and the electrode guiding portion 153 holds the longitudinal ends of the two second terminals 88 to partially embed the ends. The electrode guiding portion 153 holds the longitudinal end of one of the second terminals 88 between the guiding projection portion 153c in the center one of the three guiding projection portions 153c and the guiding projection portion 153c positioned at one end of the electrode guiding portion 153 in the longitudinal direction, and holds the longitudinal ends of the other second terminals 88 between the central guiding projection portion 153e and the guiding projection portion 153c positioned at the other end of the electrode guiding portion 153 in the longitudinal direction.

Center electrodes 25 of two electrode wires 23 and 24 drawn out from the second end 22e of the hollow insulator 22 are respectively guided by the two guiding projection portions 153c positioned on both sides of the central guiding projection portion 153c so that distal ends of the center electrodes 25 are respectively arranged on the pair of second terminals 88. The center electrodes 25 of the electrode wires 23 and 24 are respectively electrically connected to the pair of second terminals 88 by welding. In the present embodiment, the second support member 151 supports the electrode wires 23 and 24 drawn out of the second end 22e by the center electrodes 25 of the electrode wires 23 and 24 drawn out of the second end 22e of the hollow insulator 22 respectively connected to the two second terminals 88 supported by the second terminal supporting portion 152.

The lead line guiding portion 154 supports the pair of second terminals 88 together with the electrode guiding portion 153. The lead line guiding portion 154 has a substantially rectangular parallelepiped shape that extends parallel to the longitudinal direction of the electrode guiding portion 153. Further, the lead line guiding portion 154 holds the pair of second terminals 88 by embedding the other ends in the longitudinal direction. The pair of second terminals 88 supported by the electrode guiding portion 153 and the lead line guiding portion 154 extend parallel along the longitudinal direction of a sensor portion 21 in a state separated from each other.

The lead line guiding portion 154 includes a lead wire holding portion 154a protruding to a direction parallel to a thickness direction of the second terminals 88 at an end opposite from the electrode guiding portion 153. The lead wire holding portion 154a protrudes in the same direction toward which the guiding projection portions 153c project in the electrode guiding portion 153. The lead wire holding portion 154a has a pair of holding recess portions 154b formed thereon. The two holding recess portions 154b are formed on the lead wire holding portion 154a at the same interval as the pair of second terminals 88. Each of the holding recess portions 154b is provided toward a basal end from a distal end of the lead wire holding portion 154a, and penetrates the lead wire holding portion 154a in the longitudinal direction of the second terminals 88 (same as the longitudinal direction of the sensor portion 21). A width of each of the holding recess portions 154h (width in the same direction as the width direction of the second terminals 88) is substantially equal to an outer diameter of each of lead wires 101 and 102.

Further, the lead line guiding portion 154 includes two pairs of wire guiding portions 154c protruding in the direction parallel to the thickness direction of the second terminals 88 at an end closer to the electrode guiding portion 153. The wire guiding portions 154c protrude in the same direction as the lead wire holding portion 154a. The two pairs of wire guiding portions 154c are formed on the lead wire holding portion 154a in a state separated in the width direction of the second terminals 88 at the same interval as the pair of second terminals 88. Each of the wire guiding portions 154c has a square plate shape and is arranged along the thickness direction of the second terminals 88. Further, the two wire guiding portions 154c are separated in the width direction of the second terminals 88, and an interval therebetween is substantially equal to the outer diameter of the metal wire 103.

Moreover, the lead line guiding portion 154 holds two lead wires 101 and 102. The two lead wires 101 and 102 have distal ends of insulating films 104 respectively press fitted to the pair of holding recess portions 154b, and have metal wires 103 exposed at the distal ends respectively inserted between the two wire guiding portions 154c. Thus, the two lead wires 101 and 102 are held in the state in which the respective distal ends are guided to extend toward the pair of second terminals 88 at the lead line guiding portion 154. Further, the metal wires 103 exposed at the distal ends of the respective lead wires 101 and 102 are arranged on the pair of second terminals 88 by being guided by the wire guiding portions 154c configuring the pairs, and are respectively electrically connected to the second terminals 88 by welding.

A second blocking member 171 that blocks entrance of a second terminal molding resin material 162 configuring a second terminal molded member 161, described later, into the hollow insulator 22 is provided in the second end 22e of the hollow insulator 22. In the second embodiment, as a second blocking resin material 172 configuring the second blocking member 171, an ultraviolet curing resin material similar to the first blocking resin material 62 (see FIG. 9) of the first embodiment is used. The second blocking member 171 covers ends of the respective second terminals 88 in the vicinity of the electrode guiding portion 153 including portions where the center electrodes 25 of the respective electrode wires 23 and 24 are connected, and an outer circumferential surface of the electrode guiding portion 153. Further, the second blocking member 171 fills the gap S3 formed between the electrode guiding portion 153 and the second end 22e, enters the bore 22b from the opening of the bore 22b (see FIG. 3) at the second end 22e of the hollow insulator 22, and fills between the outer circumferential surface of the second spacer 83 and an inner circumferential surface of the bore 22b. That is, the second blocking member 171 closes the opening of the bore 22b at the second end 22e of the hollow insulator 22. In the second blocking member 171, the portion covering the respective second terminals 88 and the outer circumferential surface of the electrode guiding portion 153 has a film shape.

The second terminal molding resin material 162 configuring the second terminal molded member 161 is an insulative resin material similar to the first terminal molding resin material 52 (see FIG. 9) of the first embodiment. The second terminal molded member 161 includes a second terminal covering portion 163 that embeds the second support member 151, and a second bracket engagement portion 164 for fixing the sensor portion 21 to the bracket 12.

The second terminal covering portion 163 is formed integrally with the end surface of the second end 22e of the hollow insulator 22. The second terminal covering portion 163 embeds the electrode guiding portion 153 of the second support member 151, the lead wire holding portions 154a, and the pair of second terminals 88. Further, the second terminal covering portion 163 seals the second terminal supporting portion 152, the pair of second terminals 88, the connecting portions of the second terminal 88 and the center electrodes 25, and the connecting portions of the second terminals 88 and the lead wires 101 and 102 in a liquid-tight and air-tight manner. Further, the second terminal covering portion 163 embeds the second end 22e of the hollow insulator 22 therein, and seals the second end 22e of the hollow insulator 22 in a liquid-tight and air-tight manner. An outer shape of the second terminal covering portion 163 is a substantially rectangular parallelepiped shape.

The second bracket engagement portion 164 is formed integrally with a planar flat surface portion 163a on an opposite side (back side) from the guiding projection portions 153c and the lead wire holding portions 154a among the outer circumferential surface of the second terminal covering portion 163. The second bracket engagement portion 164 protrudes to form a right angle with respect to the flat surface portion 163a from a central portion of the flat surface portion 163a in a width direction at a width narrower than a width of the flat surface portion 163a. A distal end of the protruded portion (lower end in FIG. 11B) is formed with a wider width than a portion on a basal end side. Accordingly, the second bracket engagement portion 164 has a substantially T shape in a cross-section vertically intersecting the longitudinal direction of the sensor portion 21. Further, the second bracket engagement portion 164 embeds distal end side portions of the two lead wires 101 and 102 respectively connected to the two second terminals 88. The two lead wires 101 and 102 extending out from the lead line guiding portion 87 of the second terminal supporting portion 152 on an opposite side from the second spacer 83 are bent in a substantially U shape in the end of the second terminal supporting portion 152 at the opposite side from the second end 22e of the hollow insulator 22, and then extend parallel to one another along the longitudinal direction of the sensor portion 21 in the second bracket engagement portion 164. Further, the two lead wires 101 and 102 are drawn out of the second bracket engagement portion 164 from an end of the second bracket engagement portion 164 closer to the second end 22e of the hollow insulator 22. The second bracket engagement portion 164 has a basal end inserted to an engagement groove (not shown) formed at the other end in the longitudinal direction of the bracket 12 when fixing the object detection sensor 141 to the bracket 12.

Next, a method for manufacturing the object detection sensor 141 of the second embodiment will be described with reference to FIG. 3, FIG. 11A and FIG. 11B together with the operation of the object detection sensor 141. A first terminal portion 31 arranged in the vicinity of the first end 22d of the hollow insulator 22, it is manufactured in the same manner as the first embodiment. Thus, the manufacturing method will be described for the second terminal portion 142 arranged in the vicinity of the second end 22e of the hollow insulator 22.

First, a support member coupling step of coupling the second support member 151 to the hollow insulator 22 is performed. In the support member coupling step, the second support member 151 supporting the pair of second terminals 88 is coupled to the second end 22e by inserting the second spacer 83 to the bore 22b from the second end 22e of the hollow insulator 22. The second spacer 83 is inserted to the bore 22b until a pair of contact surfaces 153a contacts the second end 22e of the hollow insulator 22. Then, after the center electrodes 25 of the two electrode wires 23 and 24 are drawn out from the second end 22e guided by the three guiding projection portions 153c, and the distal ends of the respective center electrodes 25 respectively arranged on the two second terminals 88, the center electrodes 25 are electrically connected to the second terminals 88 by welding. Further, the distal ends of the two lead wires 101 and 102 are respectively press fitted to the pair of holding recess portions 154b, and the metal wires 103 exposed by removing the insulating films 104 at the distal ends of the two lead wires 101 and 102 are respectively inserted into the pair of wire guiding portions 154c. Then, the distal ends of the respective lead wires 101 and 102 guided toward the second terminals 88 by the pair of wire guiding portions 154c are electrically connected to the second terminals 88 by welding.

Next, a hardening step of forming the second blocking member 171 is performed. In the hardening step, the second blocking resin material 172, having flowability before being hardened, is applied and adhered to the portion of the second support member 151 on the outside of the hollow insulator 22, which is a portion closer to the second spacer 83 than the portion of the second terminals 88 where the center electrodes 25 are connected. A predetermined amount of the second blocking resin material 172 is arranged at the connecting portions of the two second terminals 88 with the center electrodes 25, and flows toward the second end 22e of the hollow insulator 22 along the surfaces of the second terminals 88 and the outer circumferential surface of the electrode guiding portion 153. Further, the second blocking resin material 172 covers the portions of the respective second terminals 88 where the center electrodes 25 of the respective electrode wires 23 and 24 are connected, and also covers the outer circumferential surface of the electrode guiding portion 153. Since the electrode guiding portion 153 includes the second guiding portions 153b, the second support member 151 includes the gap S3 that opens toward the outer circumferential surface of the electrode guiding portion 153, communicates with the bore 22b, and is formed between the electrode guiding portion 153 and the second end 22e when the second spacer 83 is inserted into the bore 22b and the pair of contact surfaces 153a contacts the end surface of the second end 22e of the hollow insulator 22. Thus, the second blocking resin material 172 that flows toward the second end 22e of the hollow insulator 22 along a surface of the electrode guiding portion 153 is guided by the second guiding portions 153b and is likely to flow between the end of the electrode guiding portion 153 in the vicinity of the second spacer 83 and the second end 22e of the hollow insulator 22 (that is, in the gap S3). Further, at the end surface of the second end 22e of the hollow insulator 22 in the longitudinal direction, the bore 22h includes the opening where the second spacer 83 is not arranged (opening that is not closed by the second spacer 83). Since the opening opens toward the gap S3, the second blocking resin material 172 is allowed to enter between the outer circumferential surface of the second spacer 83 inserted to the hollow insulator 22 and the inner circumferential surface of the hollow insulator 22. Accordingly, the second blocking resin material 172 covers the basal end surface of the second spacer 83 to fill the second guiding portions 153b (space S3), enters the bore 22h from the opening of the bore 22b at the second end 22e of the hollow insulator 22, and fills between the outer circumferential surface of the second spacer 83 and the inner circumferential surface of the bore 22b. That is, the second blocking resin material 172 closes the opening of the bore 22b at the second end 22e of the hollow insulator 22. Further, by irradiating ultraviolet ray to the second blocking resin material 172 and hardening the second blocking resin material 172, the second blocking member 171 is formed from the second blocking resin material 172.

Next, a terminal forming step of forming the second terminal molded member 161 is performed. In the terminal forming step, the second support member 151 and the second end 22e of the hollow insulator 22 are arranged in a mold (not shown) for forming the second terminal molded member 161, and fills the mold by injecting melted second terminal molding resin material 162. That is, in the present embodiment, the second terminal molded member 161 is formed by injection molding. In this case, the opening of the bore 22b at the second end 22e of the hollow insulator 22 is closed by the second blocking member 171. Thus, the second blocking member 171 blocks the entrance of the melted second terminal molding resin material 162 into the bore 22b, that is, into the hollow insulator 22 from the second end 22e. Accordingly, since the melted second terminal molding resin material 162 is prevented from entering the hollow insulator 22 from between the outer circumferential surface of the second spacer 83 and the inner circumferential surface of the bore 22b, the melted second terminal molding resin material 162 is prevented from entering deep into the bore by passing over the second spacer 83. Further, since the second blocking member 171 covers the connecting portions of the second terminals 88 and the center electrodes 25, the connecting portions are protected by the second blocking member 171 by filling the second terminal molding resin material 162 in the mold. Then, the second terminal molded member 161 is formed by hardening the second terminal molding resin material 162 in the mold. Accordingly, the object detection sensor 141 is completed when the second terminal portion 142 is formed at the other longitudinal end of the sensor portion 21 thereby ending the terminal forming step.

As described above, the second embodiment has the following advantage in addition to advantages of (1) to (14) of the first embodiment.

(16) The second guiding portions 153b are recessed and have simple shapes. Accordingly, the shape of the second support member 151 is prevented from becoming complicated.

The embodiments of the invention may be modified as described below.

In each embodiment, the electrical connecting portions of the first terminals 48 and the center electrodes 25 are covered by the first blocking member 61, and the electrical connecting portions of the second terminals 88 and the center electrodes 25 are covered by the second blocking member 111 and 171. However, the first blocking member 61 does not necessarily need to cover the electrical connecting portions of the first terminals 48 and the center electrodes 25 as long as it is formed to block the first terminal molding resin material 52 from entering to the inside of the hollow insulator 22. In the same manner, the second blocking members 111 and 171 do not necessarily need to cover the electrical connecting portions of the second terminals 88 and the center electrodes 25 as long as they are formed to block entrance of the second terminal molding resin materials 92 and 162 into the hollow insulator 22.

In the first embodiment, the first blocking resin material 62 may be a resin material that hardens in a shorter time than the first terminal molding resin material 52. In the same manner, the second blocking resin material 112 may be a resin material that hardens in a shorter time than the second terminal molding resin material 92. Further, in the hardening step, the first blocking resin material 62 is adhered to the first end 22d of the hollow insulator 22 when it has flowability. The second blocking resin material 112 is adhered to the second end 22e of the hollow insulator 22 when it has flowability. In this case, since the first blocking resin material 62 is hardened in a shorter time than the first terminal molding resin material 52, the time required for the hardening step can be shortened, and the process can proceed to the terminal forming step earlier. In the same manner, since the second blocking resin material 112 hardens in the shorter time than the second terminal molding resin material 92, the time required for the hardening step can be shortened, and the process can proceed to the terminal forming step earlier. This improves the productivity of the object detection sensor 13. Further, in the second embodiment, the second blocking resin material 172 may be a resin material that is hardened in a shorter time than the second terminal molding resin material 162. Further, in the hardening step, the second blocking resin material 172 is adhered to the second end 22e of the hollow insulator 22 when it has flowability. In this case, since the second blocking resin material 172 is hardened in the shorter time than the second terminal molding resin material 162, the time required for the hardening step can be shortened, and the process can proceed to the terminal forming step earlier. This improves the productivity of the object detection sensor 141.

In each embodiment, the first blocking resin material 62 is a different type of resin material from the first terminal molding resin material 52. However, the first blocking resin material 62 may be a resin material that is of the same type as the first terminal molding resin material 52. In this case, the first blocking resin material 62 is adhered to the portion of the first support member 41 outside the hollow insulator 22 in the hardening step for example under a pressure-free state. In this case, since the first blocking member 61 and the first terminal molded member 51 are formed from the same type of resin material, a plurality of types of resin materials do not need to be prepared. Accordingly, the manufacturing cost can be reduced. Further, in the first embodiment, the second blocking resin material 112 is a different type of resin material from the second terminal molding resin material 92. However, the second blocking resin material 112 may be a resin material that is of the same type as the second terminal molding resin material 92. In this case, the second blocking resin material 112 is adhered to the portion of the second support member 81 outside the hollow insulator 22 in the hardening step for example under a pressure-free state. In this case, since the second blocking member 111 and the second terminal molded member 91 are formed from the same type of resin material, a plurality of types of resin materials do not need to be prepared. Accordingly, the manufacturing cost can be reduced. The same applies to the second terminal molding resin material 162 and the second blocking resin material 172 of the second embodiment.

In each embodiment, the first blocking resin material 62 configuring the first blocking member 61 and the second blocking resin materials 112 and 172 configuring the second blocking members 111 and 171 are all ultraviolet curing resin materials. However, the first blocking resin material 62 and the second blocking resin materials 112 and 172 may be photo-curing resin materials that are not ultraviolet curing resin materials. Further, the first blocking resin material 62 and the second blocking resin materials 112 and 172 may be hot melt resin (two-component curing resin material).

In the first embodiment, although the first support member 41 includes the first spacer 43, it does not necessarily need to include the first spacer 43. Further, although the second support member 81 includes the second spacer 83, it does not necessarily need to include the second spacer 83. Further, in the second embodiment, although the second support member 151 includes the second spacer 83, it does not necessarily need to include the second spacer 83.

The shapes of the first guiding portions 47 and the second guiding portion 84 are not limited to the shapes in the first embodiment. A first guiding portion only needs to be formed on at least one of the first support member 41 and the first end 22d of the hollow insulator 22 to guide the first blocking resin material 62 between the first support member 41 and the first end 22d of the hollow insulator 22 opposing in the longitudinal direction of the hollow insulator 22. For example, the first guiding portion may be a notch positioned at the first end 22d of the hollow insulator 22 and formed to communicate with the bore 22b. Further, the first support member 41 may be coupled to the hollow insulator 22 so that the contact surfaces 46 and the first end 22d separate in the longitudinal direction of the hollow insulator 22, and a space formed between the first terminal supporting portion 42 and the first end 22d and communicated with the bore 22b in this case may be used as the first guiding portion. In the same manner, a second guiding portion only needs to be formed on at least one of the second support member 81 and the second end 22e of the hollow insulator 22 to guide the second blocking resin material 112 between the second support member 81 and the second end 22e of the hollow insulator 22 opposing in the longitudinal direction of the hollow insulator 22. Further, the same applies to the second guiding portions 153b of the second embodiment.

In the first embodiment, although the object detection sensor 13 includes the first support member 41 and the second support member 81, it does not necessarily need to include the first support member 41 and the second support member 81. Further, in the second embodiment, although the object detection sensor 141 includes the first support member 41 and the second support member 151, it does not necessarily need to include the first support member 41 and the second support member 151.

In each embodiment, by applying the first blocking resin material 62, which has flowability before being hardened, to the portion of the first support member 41 outside the hollow insulator 22, the first blocking resin material 62 is adhered to the first end 22d of the hollow insulator 22. This forms the first blocking member 61 from the first blocking resin material 62. In the same manner, by applying the second blocking resin materials 112 and 172, which have flowability before being hardened, is applied to the portions of the second support members 81 and 151 outside the hollow insulator 22, the second blocking resin materials 112 and 172 are adhered to the second end 22e of the hollow insulator 22. This forms the second blocking members 111 and 171 from the second blocking resin materials 112 and 172. However, the first blocking member 61 may be formed by filling the first blocking resin material 62 in a blocking member forming mold accommodating the first support member 41 and the first end 22d, of the hollow insulator 22. In the same manner, the second blocking members 111 and 171 may be formed by filling the second blocking resin materials 112 and 172 in a blocking member forming mold accommodating the second support members 81 and 151 and the second end 22e of the hollow insulator 22. In such cases, the first blocking member 61 and the second blocking members 111 and 171 may easily be formed with a uniform film thickness. The first blocking resin material 62 and the second blocking resin materials 112 and 172 are filled in the blocking member forming molds under a pressure that does not result in the first blocking resin material 62 and the second blocking resin materials 112 and 172 entering deep into the hollow insulator 22 by passing by the first spacer 43 and the second spacer 83.

Further, the first blocking member 61 may be formed from the first blocking resin material 62 by adhering the first blocking resin material 62, which has flowability before being hardened, to the first end 22d of the hollow insulator 22 with a syringe after inserting the first spacer 43 into the bore 22b and coupling the first support member 41 to the first end 22d of the hollow insulator 22, in this case, the first blocking resin material 62, which has flowability before being hardened, is injected into the end of the bore 22b in the vicinity of the first end 22d (in hollow insulator 22) with the syringe, and then hardened to form the first blocking member 61. As in the first embodiment, when the first guiding portion 47 is formed in the first support member 41, the first blocking resin material 62 can easily be injected into the opening of the bore 22h at the first end 22d with the syringe through the first guiding portion 47.

In the same manner, the second blocking member 111 may be formed from the second blocking resin material 112 by adhering the second blocking resin material 112, which has flowability before being hardened, to the second end 22e of the hollow insulator 22 with a syringe after inserting the second spacer 83 to the bore 22b and coupling the second support member 81 to the second end 22e of the hollow insulator 22. In this case, the second blocking resin material 112, which has flowability before being hardened, is injected into the end of the bore 22b in the vicinity of the second end 22e (in the hollow insulator 22) with the syringe, and then hardened to form the second blocking member 111. As in the second embodiment, when the second guiding portion 84 is formed on the second support member 81 and the hollow insulator 22, the second blocking resin material 112 can easily be injected into the opening of the bore 22b at the second end 22e with the syringe through the second guiding portion 84.

In each embodiment, although the first support member 41 includes the first terminals 48, it does not necessarily need to include the first terminals 48. In this case, the first support member 41 supports the center electrodes 25 of the electrode wires 23 and 24 drawn out from the first end 22d of the hollow insulator 22, and electrically connects the center electrodes 25 directly to the resistor 49 (without the first terminals 48) through soldering or the like. As a result, in the hardening step, when the first blocking resin material 62 is applied to the outer circumferential surface of the first support member 41, the center electrodes 25 are prevented from being displaced relative to the first support member 41. This prevents the center electrodes 25 from being displaced relative to the resistor 49. Accordingly, when forming the first blocking member 61, the load applied to electrically connected portions of the center electrodes 25 and the resistor 49 is reduced. In the same manner, the second support members 81 and 151 do not necessarily need to include the second terminals 88. In this case, the second support members 81 and 151 support the center electrodes 25 of the electrode wires 23 and 24 drawn out from the second end 22e of the hollow insulator 22, and electrically connects the center electrodes 25 directly to the lead wires 101 and 102 (without the second terminals 88) through welding or the like. As a result, in the hardening step, when the second blocking resin materials 112 and 172 are applied to the outer circumferential surfaces of the second support members 81 and 151, the center electrodes 25 are prevented from being displaced relative to the second support members 81 and 151. This prevents the center electrodes 25 from being displaced relative to the lead wires 101 and 102. Accordingly, when forming the second blocking members 111 and 171, the load applied to electrically connected portions of the center electrodes 25 and the lead wires 101 and 102 is reduced.

In the first embodiment, in the support member attaching step, the two lead wires 101 and 102 are electrically connected to the second terminals 88 after coupling the second support member 81 to the second end 22e of the hollow insulator 22. However, the two lead wires 101 and 102 may respectively be electrically connected to the two second terminals 88 in advance before coupling the second support member 81 to the second end 22e of the hollow insulator 22 (that is, before inserting the second spacer 83 to the bore 22b from the second, end 22e). This also applies to the support member attaching step in the second embodiment.

In each embodiment, the electrode wires 23 and 24 spirally extend in the hollow insulator 22. However, the electrode wires 23 and 24 do not necessarily need to be spiral. For example, the electrode wires 23 and 24 may extend linearly along the longitudinal direction of the hollow insulator 22.

In each embodiment, two electrode wires 23 and 24 are arranged in the hollow insulator 22. However, the number of the electrode wires arranged in the hollow insulator 22 is not limited to two, and may be three or more.

In each embodiment, the object detection sensors 13 and 141 are arranged at the peripheral edge portions of the door panel 5. However, the object detection sensors 13 and 141 may be arranged at peripheral edge portions of the back opening 4 that opposes the peripheral edge portion of the door panel 5. Further, the object detection sensors 13 and 141 are not limited to the object detection devices 11 provided in the electric back door device 2, and may be used in an object detection device provided in an electric slide door device that opens and closes an entrance provided on a side surface of a vehicle body by sliding a door panel. Further, other than being used in an object detection device provided in a door opening and closing device that performs opening and closing operations by moving a door panel by a drive force of a motor and the like, the foreign object detection sensors 13 and 141 may be used in a device for detecting a contact of an object.

The invention claimed is:

1. An object detection sensor comprising:
    an insulative and elastic hollow insulator extending in a longitudinal direction, wherein the hollow insulator includes a longitudinal end;
    a plurality of electrode wires arranged in the hollow insulator spaced apart from each other, wherein each of the electrode wires includes a drawn-out portion drawn out of the hollow insulator from the longitudinal end of the hollow insulator;
    a terminal molded member formed from an insulative terminal molding resin material, the drawn-out portions embedded in the terminal molded member; and
    a blocking member arranged at the longitudinal end of the hollow insulator, wherein the blocking member blocks entrance of the terminal molding resin material into the hollow insulator.

2. The object detection sensor according to claim 1, wherein the blocking member is formed from a blocking resin material that is applied to the longitudinal end of the hollow insulator or filled in a blocking member forming mold accommodating the longitudinal end of the hollow insulator.

3. The object detection sensor according to claim 1, further comprising a support member arranged adjacent to the longitudinal end of the hollow insulator, wherein the support member supports the drawn-out portions while preventing contact between the electrode wires.

4. The object detection sensor according to claim 3, wherein the support member includes a spacer inserted into the hollow insulator.

5. The object detection sensor according to claim 3, wherein at least one of the support member and the hollow insulator includes a guiding portion that guides the blocking resin material into between the support member and the longitudinal end of the hollow insulator.

6. The object detection sensor according to claim 4, wherein the longitudinal end of the hollow insulator includes an opening that allows entrance of the blocking resin material into between an outer circumferential surface of the spacer, which is inserted into the hollow insulator, and an inner circumferential surface of the hollow insulator.

7. The object detection sensor according to claim 1, wherein the blocking member is formed from a hot melt resin or a photocuring resin.

8. The object detection sensor according to claim 1, further comprising:
    a support member arranged adjacent to the longitudinal end of the hollow insulator, wherein the support member supports the drawn-out portions while preventing contact between the electrode wires, wherein
    the support member includes a terminal electrically connected to the portions of the electrode wires drawn out of the hollow insulator, and
    the blocking member covers an electrically connected portion of the electrode wires and the terminal.

9. A method for producing an object detection sensor, the method comprising:
    preparing an insulative and elastic hollow insulator extending in a longitudinal direction, wherein the hollow insulator includes a longitudinal end;
    arranging a plurality of electrode wires in the hollow insulator with the electrode wires spaced apart from each other, wherein each of the plurality of electrode wires includes a drawn-out portion drawn out of the hollow insulator from the longitudinal end of the hollow insulator;
    adhering an insulative blocking resin material to the longitudinal end of the hollow insulator to close the longitudinal end of the hollow insulator with the blocking resin material;
    hardening the blocking resin material after closing the longitudinal end of the hollow insulator; and
    forming a terminal molded member with an insulative terminal molding resin material so that the drawn-out portions and the hardened blocking resin material are embedded in the terminal molded member.

10. The method for producing an object detection sensor according to claim 9, wherein
    the blocking resin material hardens within a shorter time than the terminal molding resin material, and
    the blocking resin material is adhered to the longitudinal end of the hollow insulator in a flowable state.

11. The method for producing an object detection sensor according to claim 9, further comprising:
    preparing a support member including a spacer;
    arranging the support member to position the spacer in the hollow insulator and so that the support member is adjacent to the longitudinal end of the hollow insulator, wherein the spacer prevents contact between the electrode wires in the longitudinal end of the hollow insulator;
    supporting the drawn-out portions with the support member; and forming the terminal molded member with the terminal molding resin material so that at least part of the support member is embedded in the terminal molded member.

12. The method for producing an object detection sensor according to claim 11, wherein the blocking resin material is adhered to the longitudinal end when the spacer is positioned in the hollow insulator.

\* \* \* \* \*